(12) United States Patent
Song et al.

(10) Patent No.: US 7,564,084 B2
(45) Date of Patent: Jul. 21, 2009

(54) DUAL-GATE DYNAMIC RANDOM ACCESS MEMORY DEVICE HAVING VERTICAL CHANNEL TRANSISTORS AND METHOD OF FABRICATING THE SAME

(75) Inventors: Ki-Whan Song, Seoul (KR); Jong-Duk Lee, Seoul (KR); Byung-Gook Park, Seoul (KR); Hoon Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 184 days.

(21) Appl. No.: 11/513,945

(22) Filed: Aug. 31, 2006

(65) Prior Publication Data

US 2007/0051994 A1 Mar. 8, 2007

(30) Foreign Application Priority Data

Sep. 2, 2005 (KR) .................... 10-2005-0081896

(51) Int. Cl.
*H01L 27/108* (2006.01)
*H01L 29/76* (2006.01)

(52) U.S. Cl. ................. 257/296; 257/302; 257/E27.091
(58) Field of Classification Search ................. 257/296, 257/302, 330–334, E27.091
See application file for complete search history.

(56) References Cited

U.S. PATENT DOCUMENTS 6,150,687 A 11/2000 Noble et al. ................. 257/302

6,548,848 B2 4/2003 Horiguchi et al. ........... 257/296
2002/0034855 A1 * 3/2002 Horiguchi et al. ........... 438/298

FOREIGN PATENT DOCUMENTS

| JP | 2002-083945 | 3/2002 |
|---|---|---|
| JP | 2002-246571 | 8/2002 |
| JP | 2003-086712 | 3/2003 |

OTHER PUBLICATIONS

Tanaka, T., et al., "Scalability Study on a Capacitorless 1T-DRAM: From Single-gate PD-SOI to Double-gate FinDRAM," Fujitsu Laboratories Ltd., 50 Fuchigama, Akiruno 197-0833, Japan, 2004 IEEE Electron Devices Society.

* cited by examiner

*Primary Examiner*—Thanhha Pham
(74) *Attorney, Agent, or Firm*—Mills & Onello LLP

(57) ABSTRACT

A dynamic random access memory (DRAM) device has dual-gate vertical channel transistors. The device is comprised of pillar-shaped active patterns including source regions contacting with a semiconductor substrate, drain regions formed over the drain regions, and channel regions formed between the source and drain regions. The active patterns are disposed in a cell array field. On the active patterns, bit lines are arranged to connect the drain regions along a direction. Between the active patterns, word lines are arranged intersecting the bit lines. Gat insulation films are interposed between the word lines and active patterns.

8 Claims, 25 Drawing Sheets

DUAL-GATE DYNAMIC RANDOM ACCESS MEMORY DEVICE HAVING VERTICAL CHANNEL TRANSISTORS AND METHOD OF FABRICATING THE SAME

CROSS-REFERENCE TO RELATED APPLICATIONS

This U.S. non-provisional patent application claims priority under 35 U.S.C. § 119 of Korean Patent Application 2005-81896 filed in the Korean Intellectual Property Office on Sep. 2, 2005, the entire contents of which are hereby incorporated by reference.

BACKGROUND

The subject matter described herein is concerned with semiconductor devices and methods for fabricating the same. In particular, the subject matter described herein relates to a dynamic random access memory (DRAM) device having dual-gate vertical channel transistors and a method of fabricating the same.

A unit cell of a general semiconductor memory device is comprised of a single transistor and information storage. For example, a DRAM unit cell has a single capacitor as the information storage, while a flash memory unit cell has a floating gate. A static RAM cell uses a flip-flop circuit as the information storage.

There are arising various technical problems along with an increase in integration density of semiconductor devices. I particular, the shrinking-down of DRAMs in dimension makes it more difficult to assure sufficient electrostatic capacitance. Accordingly, an architecture of a DRAM that uses a semiconductor substrate (i.e., bulk) as a storage node without a capacitor has been proposed. The capacitorless DRAM is advantageous in simplicity of fabrication because it does not need the processes for making a capacitor, as well in reducing unit cell area. There is disclosed an exemplary technique for the capacitorless DRAM in U.S. Pat. No. 6,548,848 by Fumio Horiguchi, entitled, "Semiconductor Memory Device."

Such a capacitorless DRAM employs variation of threshold voltage by excessive holes present in a semiconductor substrate, being schematically classified into a single-gate structure using an SOI (silicon-on-insulator) substrate, and a dual-gate structure using a substrate interposed between two gate electrodes. According to the inquiry by T. Tanaka ("Scalability Study on Capacitorless IT-DRAM: From Single-gate PD-SOI to Double-gate FinDRAM", IEDM, 2004), the single-gate structure is required to have a gate width over 100 nm because it is sensitive to effects of shortening retention time and fluctuating threshold voltage. The single-gate structure with gate width over 100 nm is basically needed to increase impurity concentration of the channel in order to prevent a short channel effect. However, increasing impurity concentration in the channel is accompanied by an increase of leakage current, resulting in a decrease of retention time. Further, since such reduction of gate width decreases the number of charges stored in the SOI substrate, a fluctuation of the threshold voltage increases.

Because of the restriction on gate width in the single-gate structure, dual-gate structures have been suggested as new-generation DRAMs with high integration density. However, as general dual-gate DRAMs are adopting the features that source and drain regions are arranged horizontally with each other, there is a limit to scaling down a chip size. For instance, the former article by Tanaka shows layout efficiency of $9F^2$ ('F' means the least line width scalable by a photolithography process) for DRAM architecture, which is regarded as being inefficient rather than a NAND flash memory. Whereas there are proposed various techniques for enhancing the layout efficiency, those techniques result in high manufacturing costs due to complicated processing steps.

SUMMARY OF THE INVENTION

The invention is directed to a DRAM device with high layout efficiency.

The invention is also directed to a dual-gate DRAM device.

The invention is further directed to a dual-gate DRAM device fabricated through an improved, simpler process.

In one aspect, the invention is directed to a dynamic random access memory (DRAM) device which includes a semiconductor substrate having a cell array field. Pillar-shaped active patterns extend from the semiconductor substrate on the cell array field, the active patterns including source regions contacting with the semiconductor substrate, drain regions formed over the source regions, and channel regions interposed between the source and drain regions. Bit lines are arranged on the active patterns, connecting the drain regions with each other along a direction. Word lines are interposed among the active patterns, intersecting the bit lines. Gate insulation films are interposed between the word lines and the active patterns.

According to an embodiment, an area where the bit line contacts with the active pattern-is identical to an area of a top surface of the active pattern.

According to another embodiment, the DRAM device further comprises conductive patterns contacting with the source regions under the word lines.

According to still another embodiment, the DRAM device further comprises conductive patterns intersecting the word lines among the active patterns. The conductive patterns are connected to the source regions under the word lines.

In one embodiment, the DRAM device further comprises an epitaxial layer with single crystalline structure in a predetermined thickness between the conductive pattern and the word line adjacent to the conductive pattern. The epitaxial layer has an impurity region having the same impurity and the same concentration with the source region, the impurity region electrically connecting the source region to the conductive pattern.

In one embodiment, the gate insulation film extends to be interposed between the conductive pattern and the wordline adjacent to the conductive pattern.

According to another aspect, the invention is directed to a method of fabricating a DRAM device, including a step of forming bit lines without forming contact holes. The method comprises the steps of: preparing a semiconductor substrate; patterning the semiconductor substrate to form first trenches that define active regions in the form of bars; forming gate insulation films on inner walls of the first trenches; forming word lines on the inner walls of the first trenches including the gate insulation films; forming first insulation patterns to fill the first trenches including the word lines; forming mask patterns that intersect the first trenches on the first insulation patterns; patterning the active regions using the mask patterns as an etching mask to form active patterns in the shape of pillars; removing the mask patterns to form openings that expose top surfaces of the active patterns; and forming bit lines intersecting the word lines while directly contacting with the top surfaces of the active patterns.

In one embodiment, the gate insulation film comprises at least one material selected from the group consisting of silicon oxide, silicon nitride, silicon oxynitride, $Al_2O_3$, $Al_xSi_yO_z$, (Ba, Sr) $TiO_3$, $BeAl_2O_4$, $CeO_2$, $CeHfO_4$, $CoTiO_3$ $Si_2N_4$, $EuAlO_3$, $HfO_2$, Hf-silicate, $La_2O_3$, $LaAlO_3$, $LaScO_3$, $La_2SiO_5$, $MaAl_2O_4$, $NdAlO_3$, $PrAlO_3$, $SmAlO_3$, $SrTiO_3$, $Ta_2O_5$ $TiO_2$, $Y_2O_5$, $Y_xSi_yO_z$, $ZrO_2$, Zr-silicate, Zr-Al-O, and (Zr, Sn) $TiO_4$.

In one embodiment, the forming of the word lines comprises: conformably forming a gate conductive film on the resultant structure including the first trenches, in a thickness less than a half width of the first trench; and anisotropically etching the gate conductive film until exposing the gate insulation films to form spacer-shaped gate patterns on sidewalls of the gate insulation films.

In one embodiment, the forming of the word lines further comprises: forming protection patterns between the gate patterns; and recessing top surfaces of the gate patterns until being lower than the top surfaces of the active patterns.

In one embodiment, the forming of the active patterns comprises: selectively etching the active regions between the mask patterns with using the mask patterns, the gate insulation films, and the first insulation patterns as etching protection films to form second trenches defined by the active patterns and the word lines.

In one embodiment, the method further comprises, before removing the mask patterns, the step of: forming a second insulation film to fill the second trenches; and planarizingly etching the second insulation film until exposing top surfaces of the mask patterns to form second insulation patterns filling the second trenches.

In one embodiment, the forming of the first trenches comprises: forming bar-shaped first mask patterns to define the active regions; and anisotripically etching the semiconductor substrate by using the first mask patterns as an etching mask. The first mask patterns are patterned in the step of forming the active patterns to be disposed between the active patterns and the mask patterns.

In one embodiment, the removing of the mask patterns comprises: removing the mask patterns to expose top surfaces of the first mask patterns, the first insulation patterns, and the second insulation patterns; and selectively removing the first mask patterns by a recipe with etching selectivity with respect to the first and second insulation patterns, such that the openings are self-aligned to the tops of the active patterns.

In one embodiment, the forming of the bit lines comprises: forming a bit-line conductive film on the resultant structure including the openings, the bit-line conductive film being directly contacted to the top surfaces of the active patterns; and patterning the bit-line conductive film to the bit lines that intersect the word lines.

According to an embodiment, the preparing of the semiconductor substrate comprises: forming conductive patterns, on a bottom substrate, at regions where the word lines are arranged; and forming an epitaxial layer to cover the conductive patterns using a seed layer with the bottom substrate exposed among the conductive patterns. The first trenches are formed by way of etching the epitaxial layer on the conductive patterns, exposing top surfaces of the conductive patterns. Here, depths of the first trenches are less than a thickness of the epitaxial layer disposed on the conductive patterns.

According to another aspect, the invention is directed to a method of fabricating a DRAM device comprising the steps of: patterning a semiconductor substrate to form first trenches that define active regions in the shape of bars; forming conductive patterns on bottoms of the first trenches; patterning the active regions in a direction perpendicular to the first trenches to form second trenches to define active patterns in the shape of pillars; forming word lines on inner walls of the second trenches, the word lines intersecting the first trenches; and forming bit lines to contact directly with top surfaces of the active patterns and to intersect word lines. The second trenches are less than the first trenches in depth by a thickness of the conductive pattern so as to isolate the word lines from the conductive patterns.

In one embodiment, the forming of the conductive patterns comprises: forming a liner film on the resultant structure including the first trenches; anisotropically etching the liner film to form liner patterns that expose bottom surfaces of the first trenches but cover sidewalls of the first trenches; forming a conductive film to fill the first trenches including the liner patterns; and etching the conductive film by using the liner patterns as a mask to form conductive patterns having a thickness less than depths of the first trenches on the bottoms of the first trenches.

In one embodiment, the forming of the conductive patterns comprises: forming the conductive film of a metallic material containing cobalt or tungsten; performing a silicidation process to form silicide patterns on the bottoms of the first trenches, the silicide patterns resulting from the reaction between the conductive film and the conductive film, which is contacted directly to the bottom of the first trench, during the silicidation process; and selectively removing the conductive film by a recipe with etching selectivity with respect to the silicide and liner patterns to expose top surfaces of the silicide patterns.

In one embodiment, the forming of the first trenches comprises: forming first mask patterns in the shape of bars to define the active regions; and anisotripically etching the semiconductor substrate with using the first mask patterns as an etching mask, wherein the forming of the second trenches comprises: forming first insulation patterns among the first mask patterns to fill the first trenches; forming second mask patterns crossing over the first trenches on the first insulation patterns and the first mask patterns; and anisotropically etching the first insulation patterns, the first mask patterns, and the active regions using the second mask patterns as an etching mask. The forming of the second trenches is performed such that the first insulation patterns remain on the conductive patterns.

In one embodiment, the first mask patterns are patterned in the step of forming the second trenches to be interposed between the active patterns and the second mask patterns.

In one embodiment, the method further comprises: forming gate insulation films on sidewalls of the active patterns which are exposed by the second trenches, before forming the word lines; and forming a second insulation film filling the second trenches, after forming the word lines.

In one embodiment, the gate insulation film comprises at least one material selected from the group consisting of silicon oxide, silicon nitride, silicon oxynitride, $Al_2O_3$, $Al_xSi_yO_z$, (Ba, Sr) $TiO_3$, $BeAl_2O_4$, $CeO_2$, $CeHfO_4$, $CoTiO_3$, $Si_2N_4$, $EuAlO_3$, $HfO_2$, Hf-silicate, $La_2O_3$, $LaAlO_3$, $LaScO_3$, $La_2SiO_5$, $MaAl_2O_4$, $NdAlO_3$, $PrAlO_3$, $SmAlO_3$, $SrTiO_3$, $Ta_2O_5$, $TiO_2$, $Y_2O_5$, $Y_xSi_yO_z$, $ZrO_2$, Zr-silicate, Zr-Al-O, and (Zr, Sn) $TiO_4$.

In one embodiment, the forming of the word lines comprises: conformably forming a gate conductive film on the resultant structure including the second trenches, in a thickness less than a half width of the second trench; and anisotropically etching the gate conductive film until exposing the gate insulation films to form spacer-shaped gate patterns on sidewalls of the gate insulation films.

In one embodiment, the forming of the word lines comprises: forming protection patterns disposed between the gate patterns; and recessing top surfaces of the gate patterns until being lower than the top surfaces of the active patterns.

In one embodiment, the method further comprises, before forming the bit lines, sequentially removing the first and second mask patterns to expose top surfaces of the active patterns. The removing of the mask patterns comprises selectively removing the first mask patterns using an etching recipe with etching selectivity with respect to the first and second insulation patterns, such that the openings are self-aligned on the active patterns.

BRIEF DESCRIPTION OF THE FIGURES

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

FIGS. 1A through 5A are perspective views illustrating processing steps for fabricating a DRAM device in accordance with a first embodiment of the invention.

FIGS. 1B through 5B are sectional views illustrating processing steps for fabricating a DRAM device in accordance with the first embodiment of the invention, taken along the dashed line I-I' of FIGS. 1A through 5A.

FIGS. 1C through 5C are sectional views illustrating processing steps for fabricating a DRAM device in accordance with the first embodiment of the invention, taken along the dashed line II-II' of FIGS. 1A through 5A.

FIGS. 8A through 12A are perspective views illustrating processing steps for fabricating a DRAM device in accordance with a second embodiment of the invention.

FIGS. 8B through 12B are sectional views illustrating processing steps for fabricating a DRAM device in accordance with the second embodiment of the invention, taken along with the dashed line I-I' of FIGS. 8A through 12A, respectively.

FIGS. 8C through 12C are sectional views illustrating processing steps for fabricating a DRAM device in accordance with the second embodiment of the invention, taken along with the dashed line II-II' of FIGS. 8A through 12A, respectively.

DETAILED DESCRIPTION OF PREFERRED EMBODIMENTS

Figure 1A:
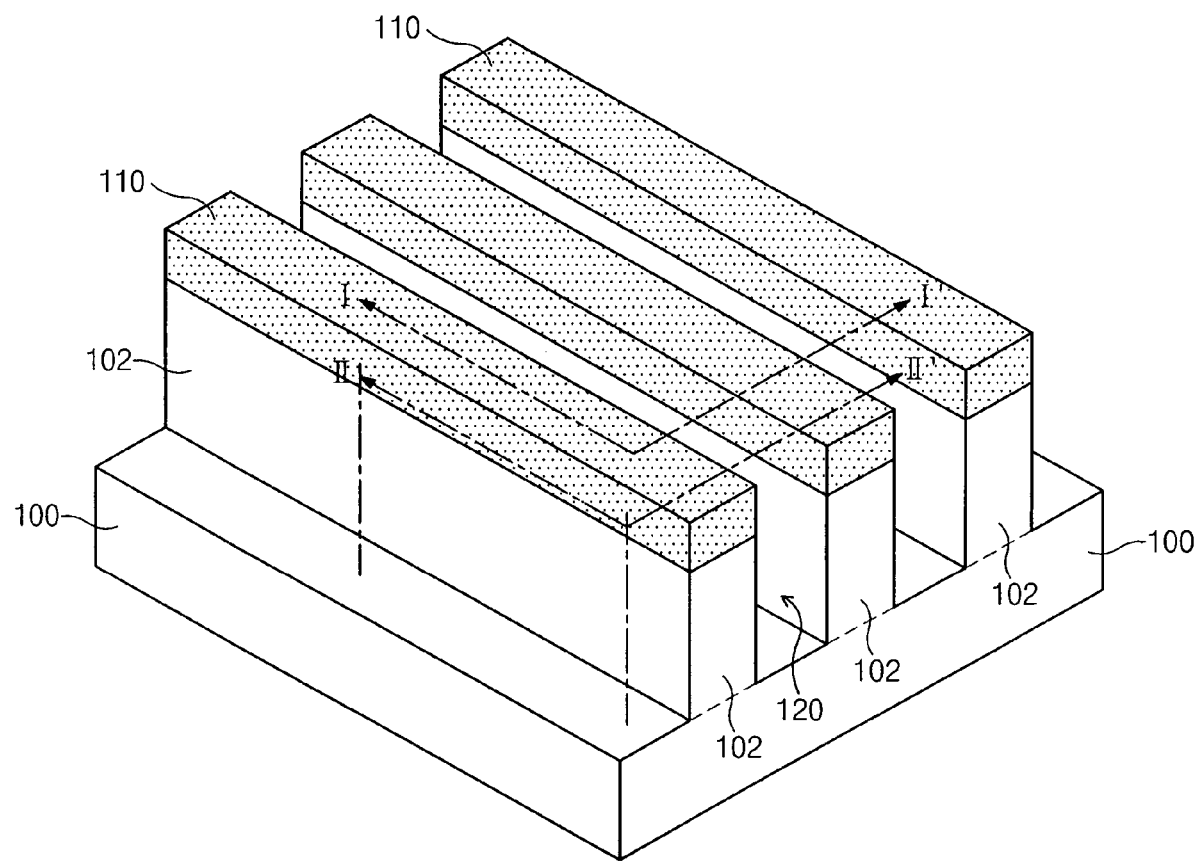

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art.

In the figures, the dimensions of layers and regions are exaggerated for clarity of illustration. It will also be understood that when a layer (or film) is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIGS. 1A through 5A are perspective views illustrating processing steps for fabricating a DRAM device in accordance with a first embodiment of the invention, and FIGS. 1B through 5B and 1C through 5C are sectional views illustrating processing steps for fabricating a DRAM device in accordance with the first embodiment of the invention, taken along the dashed lines I-I' and II-II', respectively, of FIGS. 1A through 5A.

Figure 1B:
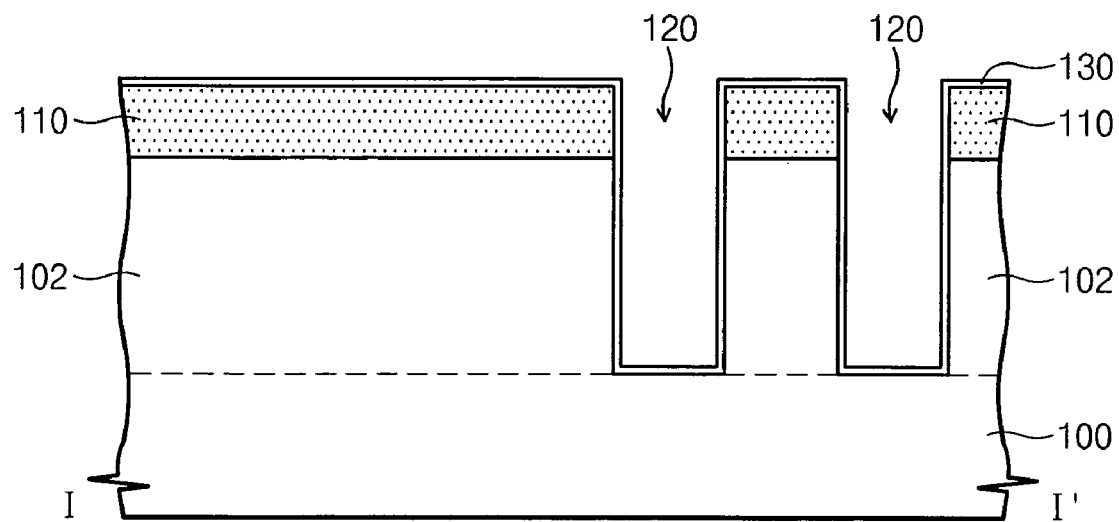
Figure 1C:
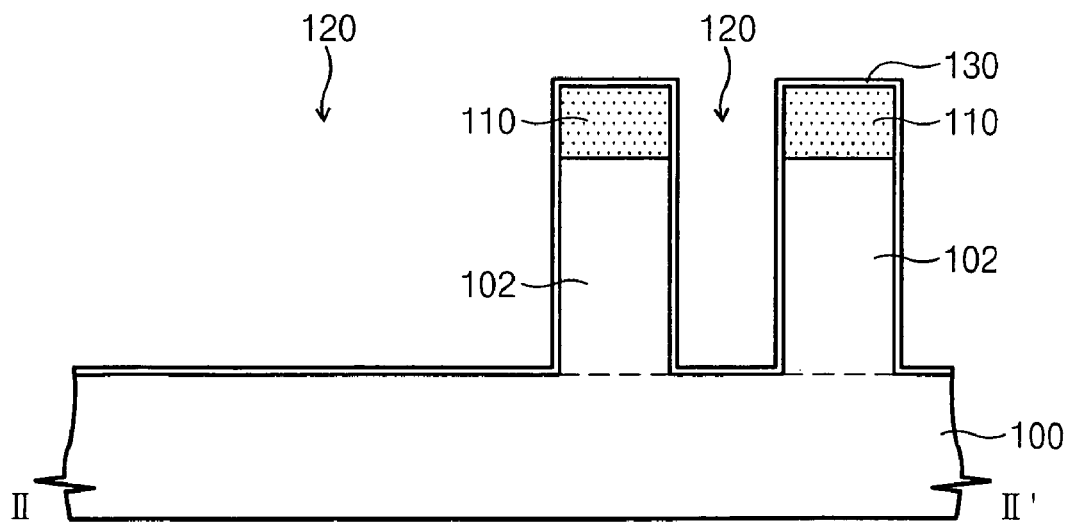

Referring to FIGS. 1A through 1C, first mask patterns 110 are formed on a semiconductor substrate 100. The first mask patterns 110 are made of at least one of silicon oxide, silicon nitride, and polycrystalline silicon, preferably of at least silicon oxide and silicon nitride, stacked in sequence. The first mask patterns 110 are arranged in parallel with each other in the shape of bars on a cell array field where pluralities of memory cell transistors are formed.

The semiconductor substrate 100 is selectively etched away in an anisotropic mode under the first mask pattern layers 110. Thus, first trenches 120 are formed between the first mask patterns 110, defining active regions 102 therebetween. According to this embodiment, as source, drain, and channel regions of memory cell transistors are formed in the active regions 102, electrical characteristics of the transistors are influenced from physical qualities of the active regions 102. Considering this fact, additional processing steps may be carried out to the first trenches 120 so as to improve the physical qualities of the active regions 102.

According to a feature of the invention, the additional processing steps may be further comprised of thermal oxidation and liner formation. The thermal oxidation is helpful in curing etching damage on inner walls of the first trenches 120. The etching damage can occur during an anisotropic etching process for shaping the first trenches 120. The liner formation may include a step of depositing an impurity stopping film (e.g., a silicon nitride film), by which a liner film 130 functions to prevent impurities from penetrating the active regions 102 during the subsequent processing step. The thermal oxide film and the liner film 130 are not shown in FIG. 1A (but shown in FIG. 1B) for clarity of illustration.

Figure 2A:
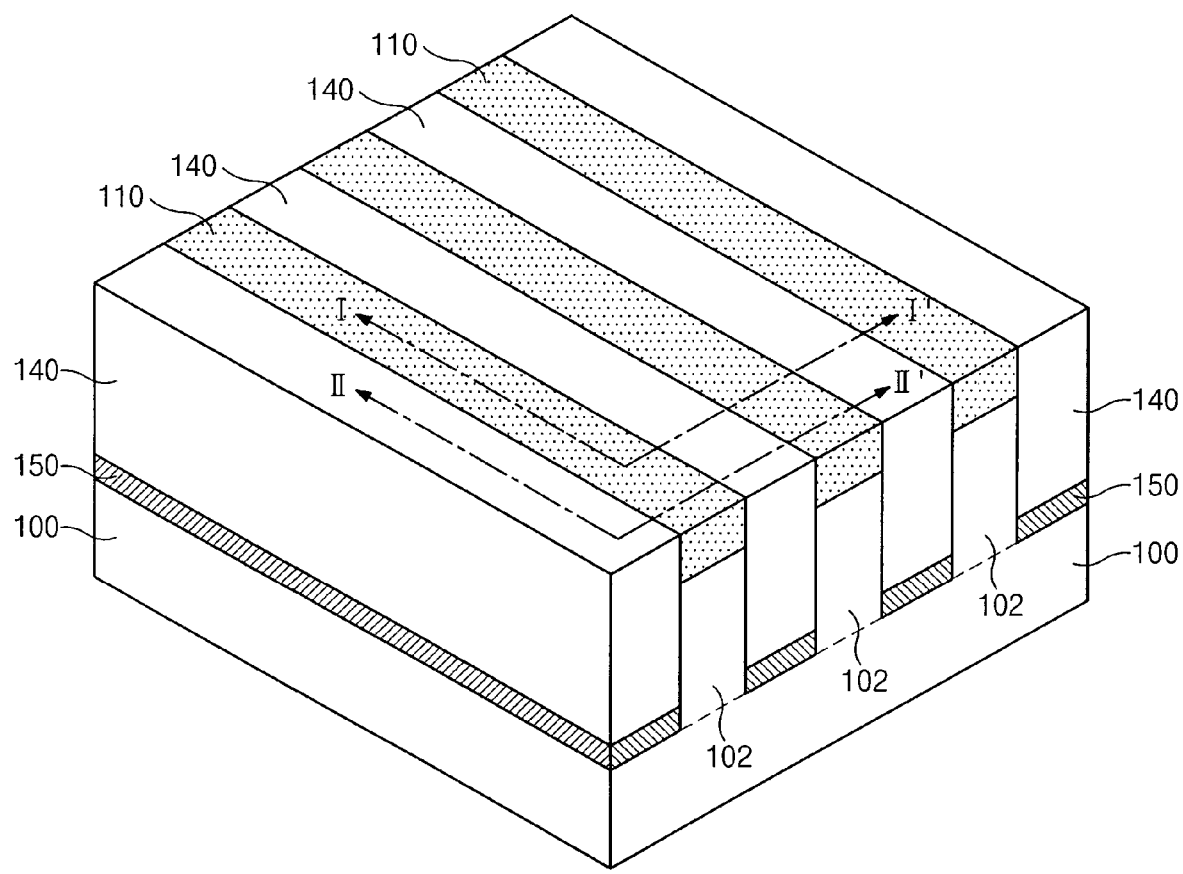
Figure 2B:
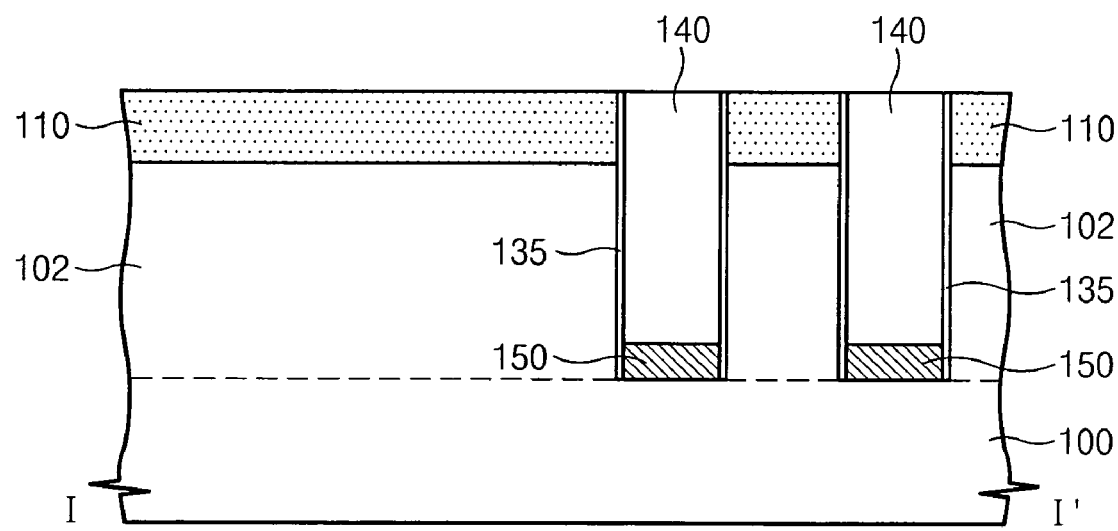
Figure 2C:
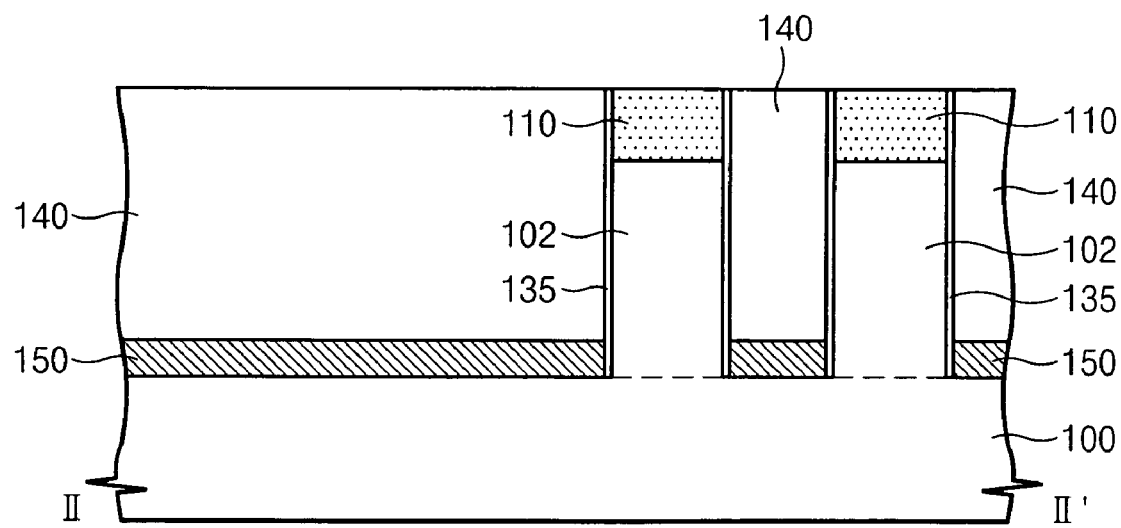

Next, referring to FIGS. 2A through 2C, first insulation-film patterns 140 are formed to fill the first trenches 120. The step of forming first insulation-film patterns 140 comprises depositing a first insulation film filling the first trenches 120 and etching the first insulation film to expose the top surfaces of the first mask patterns 110. The first insulation film is made of at least one insulating material having etching selectivity with respect to the first mask patterns 110. According to the embodiments of the invention, the first insulation film may be made up of silicon oxide. The first insulation film may be etched by means of a chemical-mechanical polishing (CMP)

process. In this case, the first insulation-film patterns 140 are formed to have top surfaces level with those of the first mask patterns 110, as shown in FIG. 2A.

In another feature of the invention, conductive patterns 150 contacting directly with the semiconductor substrate 100 may be disposed on the bottoms of the first trenches 120. In more detail, before forming the first insulation film, the liner film 130 is anisotropically etched to expose the bottom surfaces of the first trenches 120. Thus, liner patterns 135 are formed on sidewalls of the first trenches 120 to expose the bottom surfaces of the first trenches 120 (i.e., a part of the semiconductor substrate 100). Thereafter, the conductive patterns 150, which have a thickness less than the depth of the first trench 120, are formed on the bottom surfaces of the first trenches 120.

The processing step of forming the conductive patterns 150 may include a step of recessing a conductive film that is filling the first trenches 120. The conductive patterns 150 may be silicide patterns completed by way of a process for silicide formation. The process for silicide formation (silicidation) includes a step of depositing at least one of metals which turn to a silicide by reacting with the exposed surfaces of the semiconductor substrate 100. The metal for silicidation can be cobalt (Co) or tungsten (W). Even after the silicidation process, a part of the conductive film, which has not changed into the silicide, is removed by an etching process. As a result, only the silicide patterns remain at the lower surfaces of the first trenches 120. The process for removing the conductive film may be comprised of a wet etching step utilizing an etch recipe with etching selectivity to the silicide patterns 150 and the liner patterns 135.

Figure 3A:
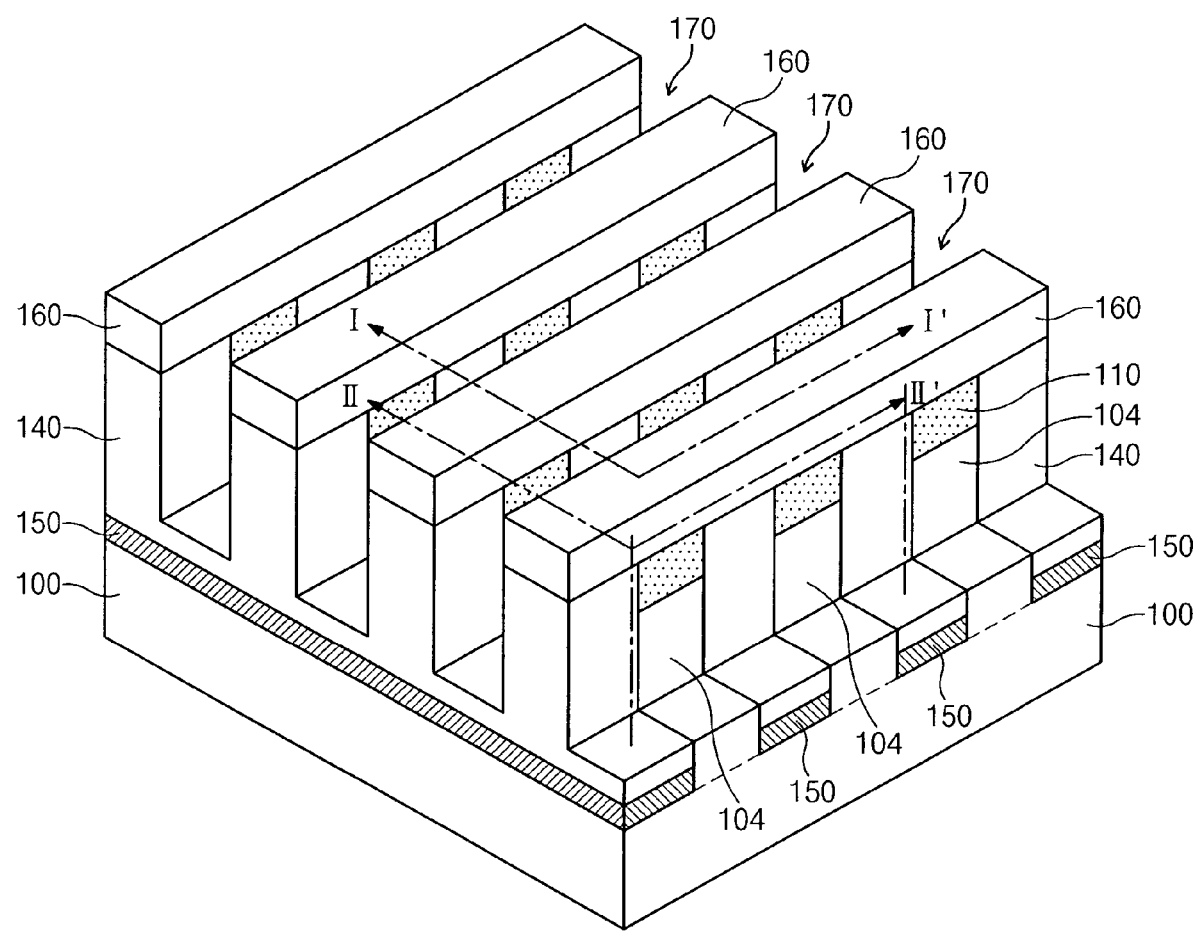
Figure 3B:
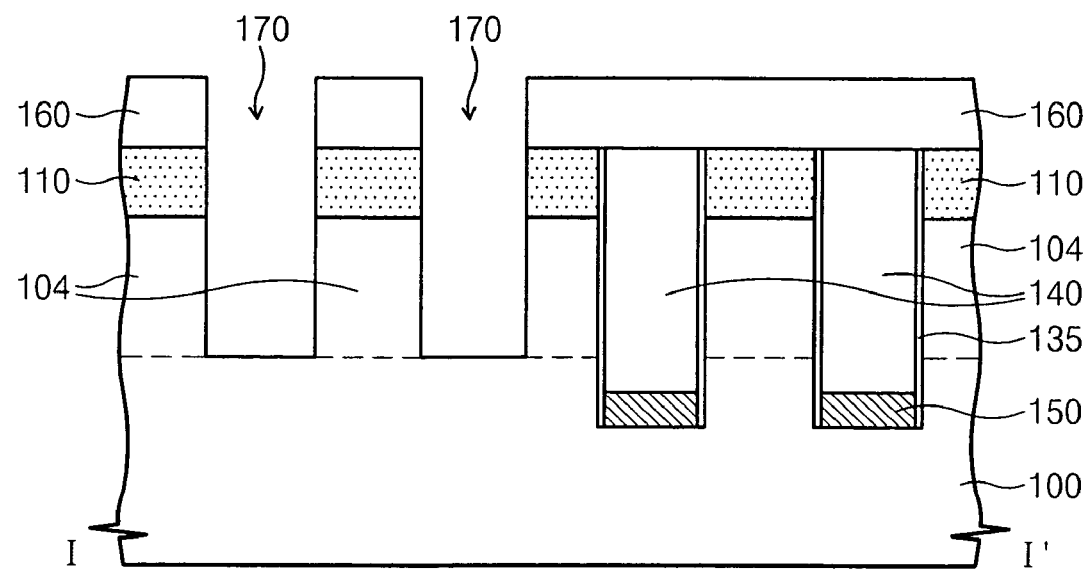
Figure 3C:
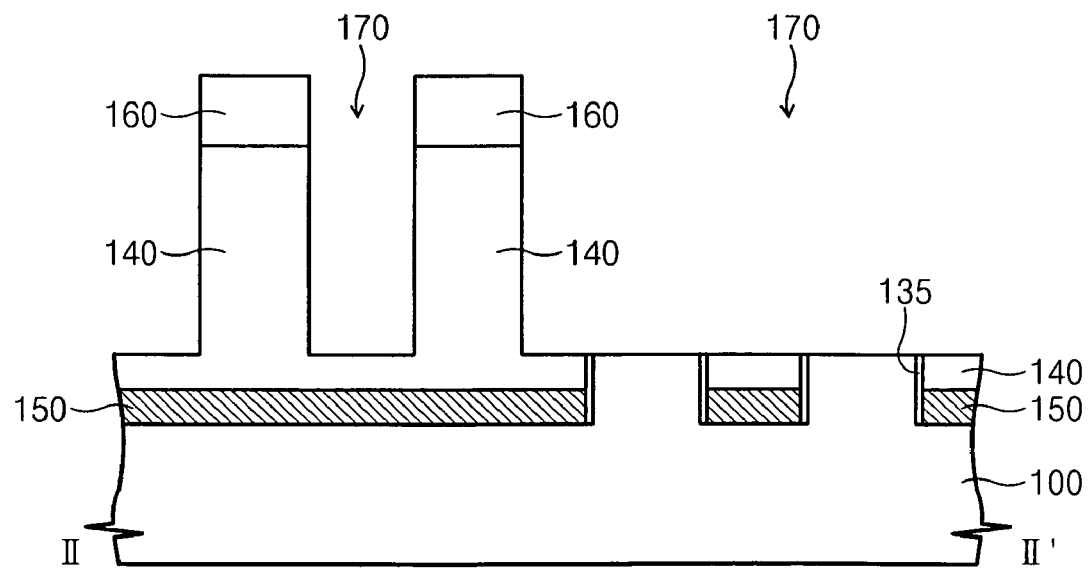

Referring to FIGS. 3A and 3C, second mask patterns 160 are formed on the first insulation patterns 140. The second mask patterns 160 are arranged intersecting the first trenches 120 and, as with the first mask patterns 110, parallel with each other in the form of bars on the cell arrany field. It is preferred that the second mask patterns 160 be made of a material having etching selectivity to the first insulation patterns 140, the first mask patterns 110, and the semiconductor substrate 100. For instance, the second mask patterns 160 may be formed of silicon nitride and polysilicon stacked in sequence.

The first insulation patterns 140, the first mask patterns 110, and the active regions 102 are anisotropically and selectively etched away under the second mask patterns 160, resulting in second trenches 170 that intersect the first trenches 120. The active regions 102 are patterned by this etching process and then become active regions 104 defined by the first and second trenches 120 and 170. The active patterns 104 are formed at regions where the first and second mask patterns 110 and 160 intersect with each other, and exposed on their sidewalls along one direction by the second trenches 170.

When the second mask patterns 160 are formed of a sequentially stacked silicon nitride and polysilicon film, the second trenches 170 may be completed by way of first and second etching steps. The first mask pattern 110 and the first insulation pattern 140 are etched, in the first etching step, until the top surfaces of the active regions 102 are exposed, and the exposed active regions 102 and the first insulation patterns 140 are etched in the second etching step. The first etching step uses an etch recipe with etching selectivity to polysilicon, while the second etching step uses an etch recipe with etching selectivity to silicon nitride. At this time, the polysilicon film of the second mask pattern 160 may be removed for the second etching step, but the silicon nitride film under the polysilicon film is used as an etching mask for the second etching step.

According to the embodiment including the forming of the conductive patterns 150, the bottoms of the second trenches 170 are at a level higher than those of the first trenches 120. For this configuration, the second etching step may employ an etch recipe capable of providing a larger etch rate for silicon relative to silicon oxide. From this processing feature, the top surfaces of the conductive patterns 150 are spaced from the bottoms of the second trenches 170. That is, the top surfaces of the conductive patterns 150 are not exposed by the second trenches 170.

Figure 4A:
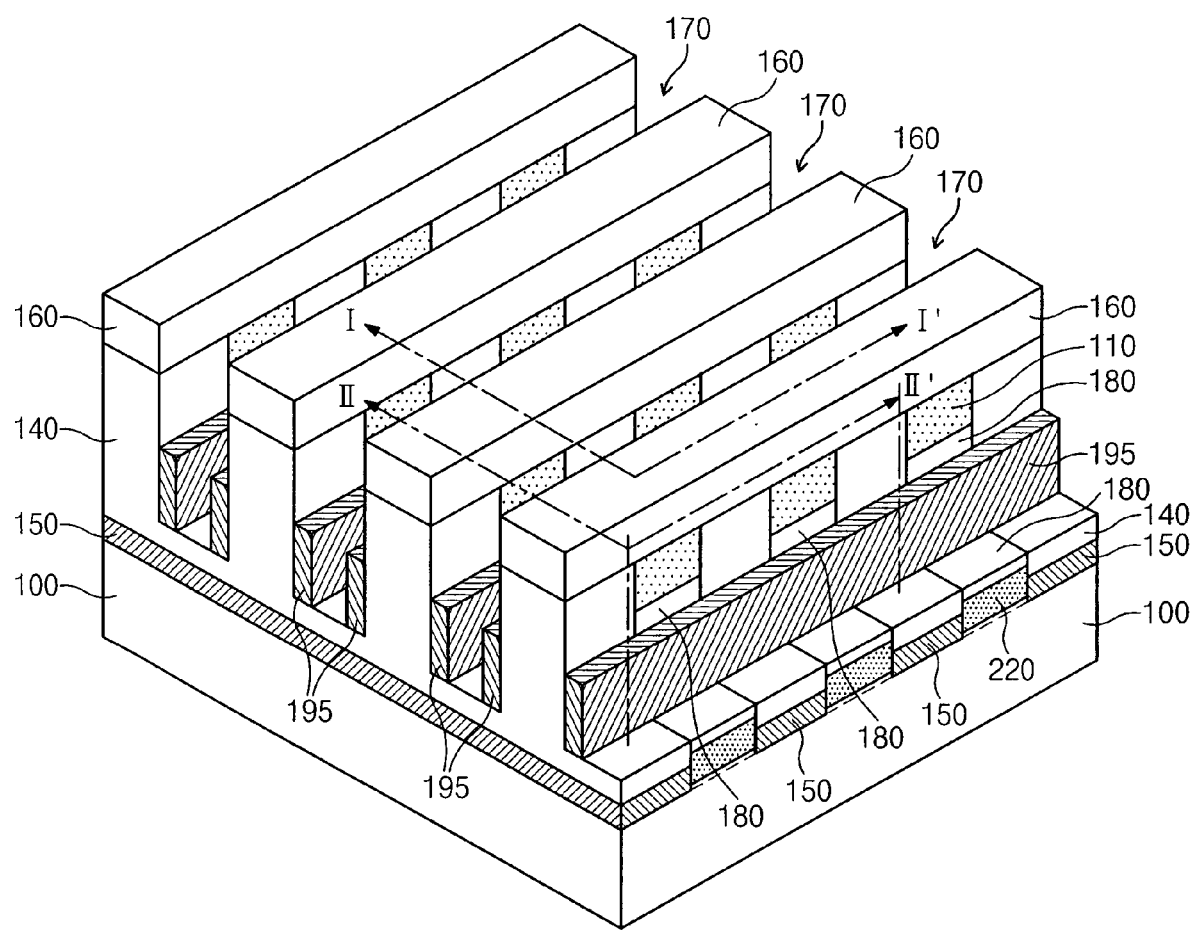
Figure 4B:
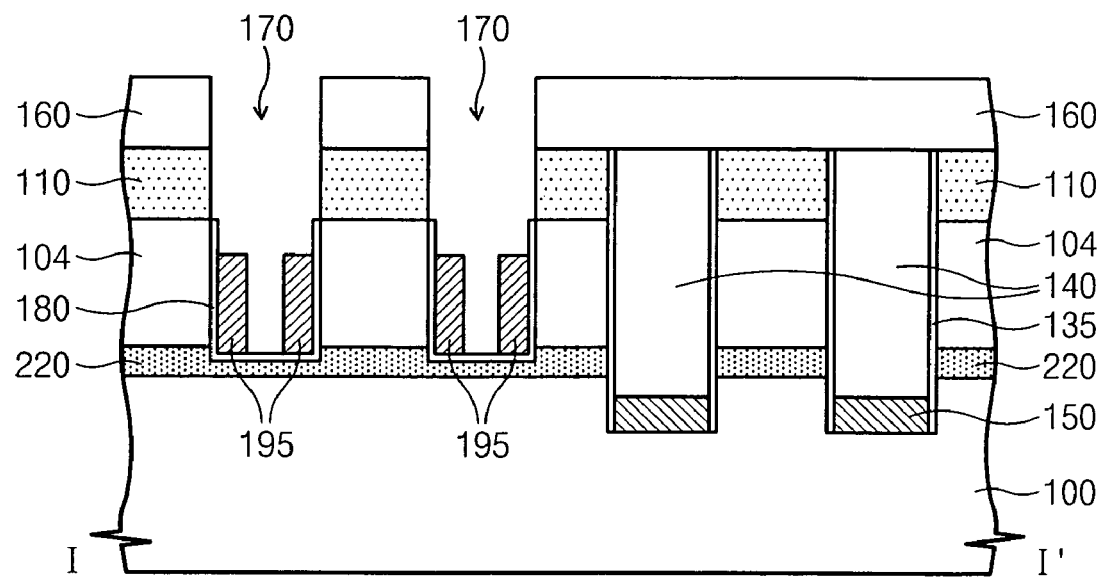
Figure 4C:
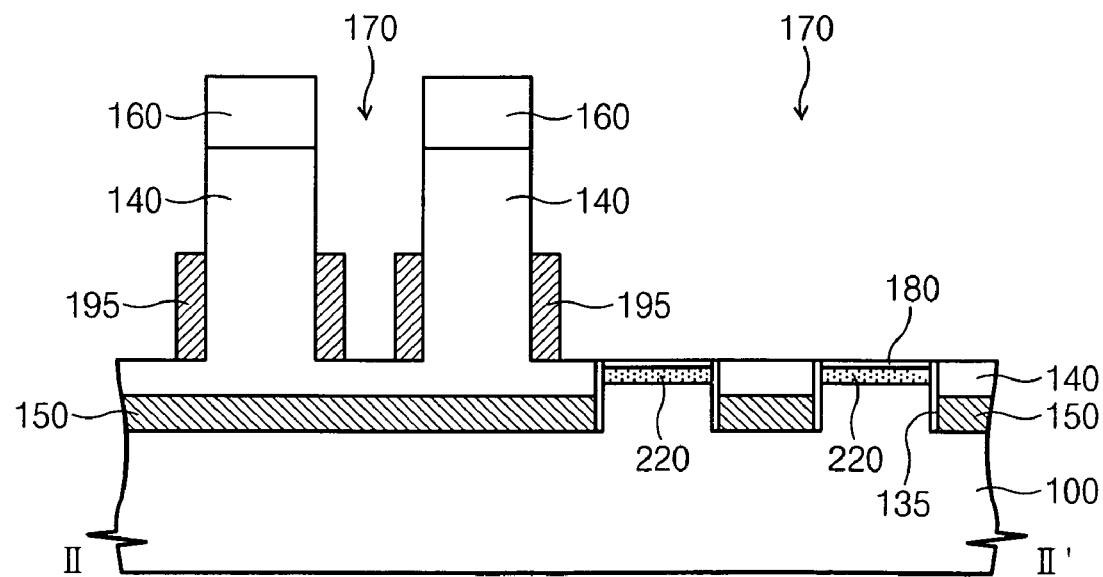

Referring to FIGS. 4A through 4C, gate insulation films 180 are formed on sidewalls of the active patterns 104 that are exposed through the second trenches 170. The gate insulation films 180 may be made of at least one material selected from the group consisting of silicon oxide, silicon nitride, silicon oxynitride, $Al_2O_3$, $Al_xSi_yO_z$, (Ba, Sr) $TiO_3$, $BeAl_2O_4$, $CeO_2$, $CeHfO_4$, $CoTiO_3$, $Si_2N_4$, $EuAlO_3$, $HfO_2$, Hf-silicate, $La_2O_3$, $LaAlO_3$, $LaScO_3$, $La_2SiO_5$, $MaAl_2O_4$, $NdAlO_3$, $PrAlO_3$, $SmAlO_3$, $SrTiO_3$, $Ta_2O_5$, $TiO_2$, $Y_2O_5$, $Y_xSi_yO_z$, $ZrO_2$, Zr-silicate, Zr-Al-O, and (Zr, Sn) $TiO_4$. The forming of the gate insulation films 180 is preferred to employ thermal oxidation, or deposition for another types of film material.

Figure 6A:
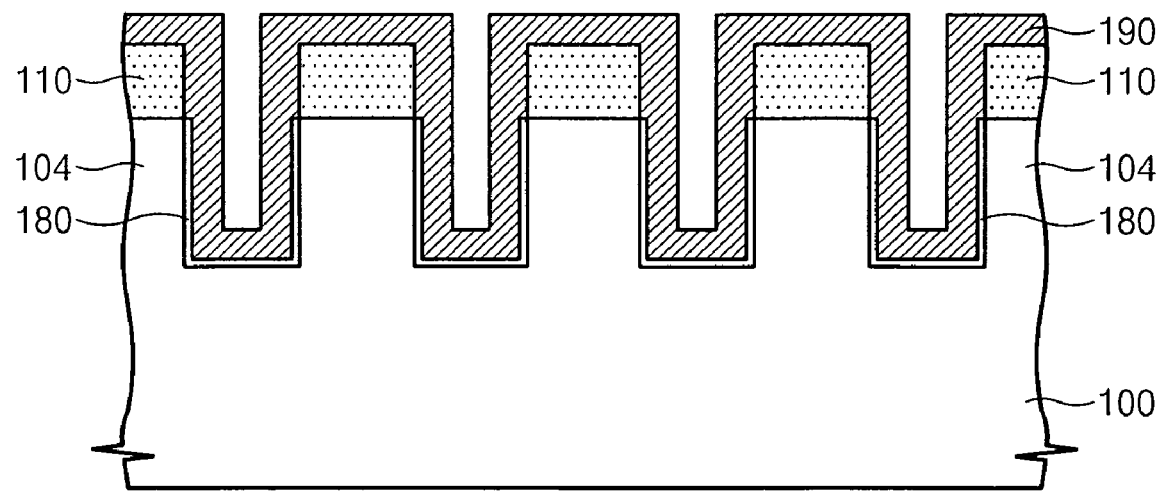
FIGS. 6A through 6C are sectional views illustrating processing steps for fabricating word lines in accordance with the invention.
Figure 6B:
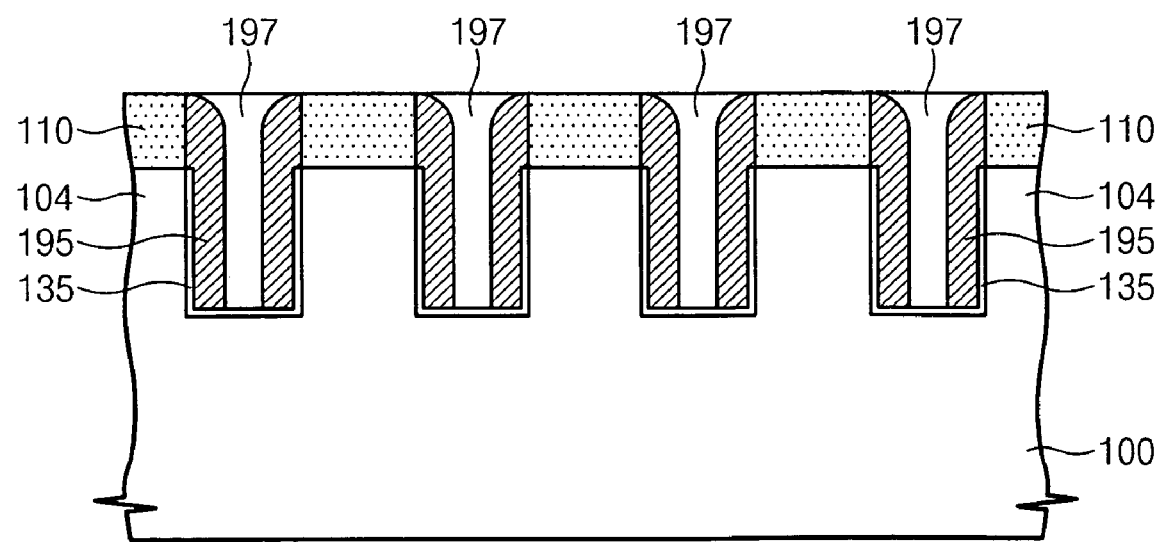

Word lines 195 are formed on inner walls of the second trenches 170 including the gate insulation films 180. According to the invention, top surfaces of the word lines 195 are at a level lower than that of the active patterns 104. Forming the word lines 195 includes a step of depositing a gate insulation film 190 with a conformable thickness on the resultant structure having the gate insulation films 180, as shown in FIG. 6A. During this process, in order to prevent an over-hang effect that causes the gate conductive films 190 to meet with each other over the second trenches 170, the gate conductive film 190 is deposited with a thickness less than a half width of the second trench 170.

Figure 6C:
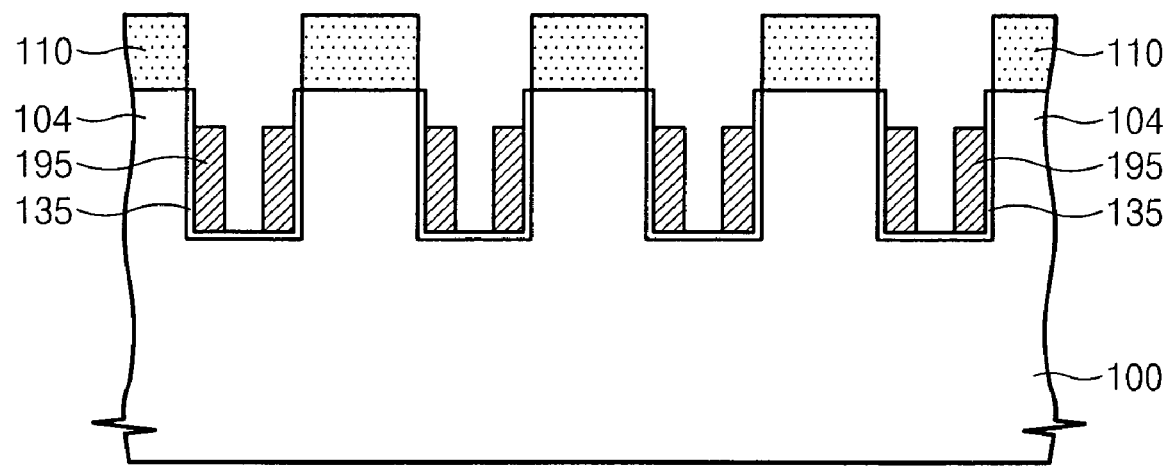

As illustrated in FIGS. 6A and 6C, the gate conductive film 190 is anisotropically etched away until the top surfaces of the gate insulation films 180 are exposed, forming spacer-shaped gate patterns disposed on sidewalls of the second trenches 170. These gate patterns are used as the word lines 195. However, since top surfaces of the gate patterns 195 are at a level higher than the top surfaces of the active patterns 104, it is necessary to conduct a recessing process for lowering the height of the gate patterns 195. The recessing process includes a step of etching the gate patterns 195, after forming protection films 197 to fill up the second trenches 170 including the gate patterns 195, along with the protection film 197 until the top surfaces of the gate patterns 195 become lower than the top surfaces of the active pattern 104 (see FIG. 6C). The protection film 197 would remain between the word lines 196 for electrical isolation. According to another embodiment of the invention, the protection film 197 may be removed therefrom.

Figure 7:
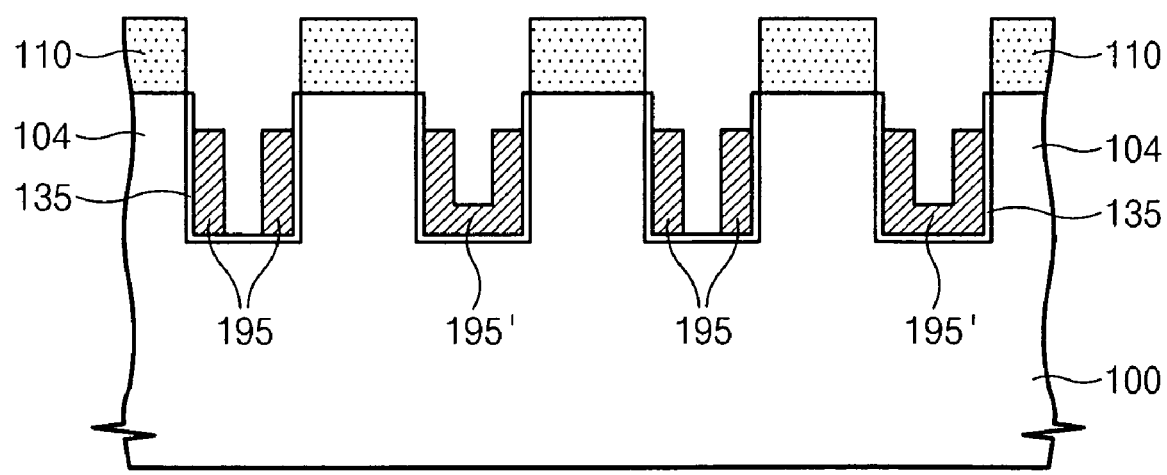
FIG. 7 is a sectional view illustrating processing steps for fabricating word lines in accordance with a modified embodiment of the invention.

According to the aforementioned embodiments, gate patterns 195, which are electrically insulated from each other, are disposed in one of the second trenches 170. However, according to another modified embodiment, a single one of the gate patterns 195' is disposed in some second trenches 170, as shown in FIG. 7. This modified embodiment may include a step of forming an etching mask, which serves to prevent an etching of the gate conductive films 190 in the second trenches 170 in the step of anisotropically etching the gate conductive films 190. According to this modified embodiment, non-isolated gate patterns 195' are used as back-gate electrodes for applying a reverse voltage to the active patterns 104. The front-gate electrodes 195 used for selecting cells are disposed between the back-gate electrodes 195'. As a result, according to this modified embodiment, the back-gate electrodes 195' and the front-gate electrodes 195 are alternately arranged as illustrated in FIG. 7. This structural feature will be described in more detail below.

Prior to forming the gate insulation films 180, an ion implantation process is carried out using the second mask patterns 160 as an ion implantation mask, resulting in lower impurity regions 220 in the semiconductor substrate 100 that is being partially exposed by the second trenches 170. The lower impurity regions 220 contain impurities with conductivity different from that of the semiconductor substrate 100. The impurities of the lower impurity regions 220 may be diffused into lower regions of the active patterns 104 during the subsequent thermal processes (e.g., a thermal process of forming the gate insulation films 180). Thus, the lower impurity regions 220 may be used as source regions of transistors.

According to another embodiment by the invention, the forming of the lower impurity regions 220 may be carried out after completing the word lines 195. The conductive patterns 150 may be formed of polysilicon containing high concentration impurities In this case, the impurities included in the conductive patterns 150 may be diffused into the lower regions of the active patterns 104, forming the lower impurity regions 220 to be used as the source regions.

Figure 5A:
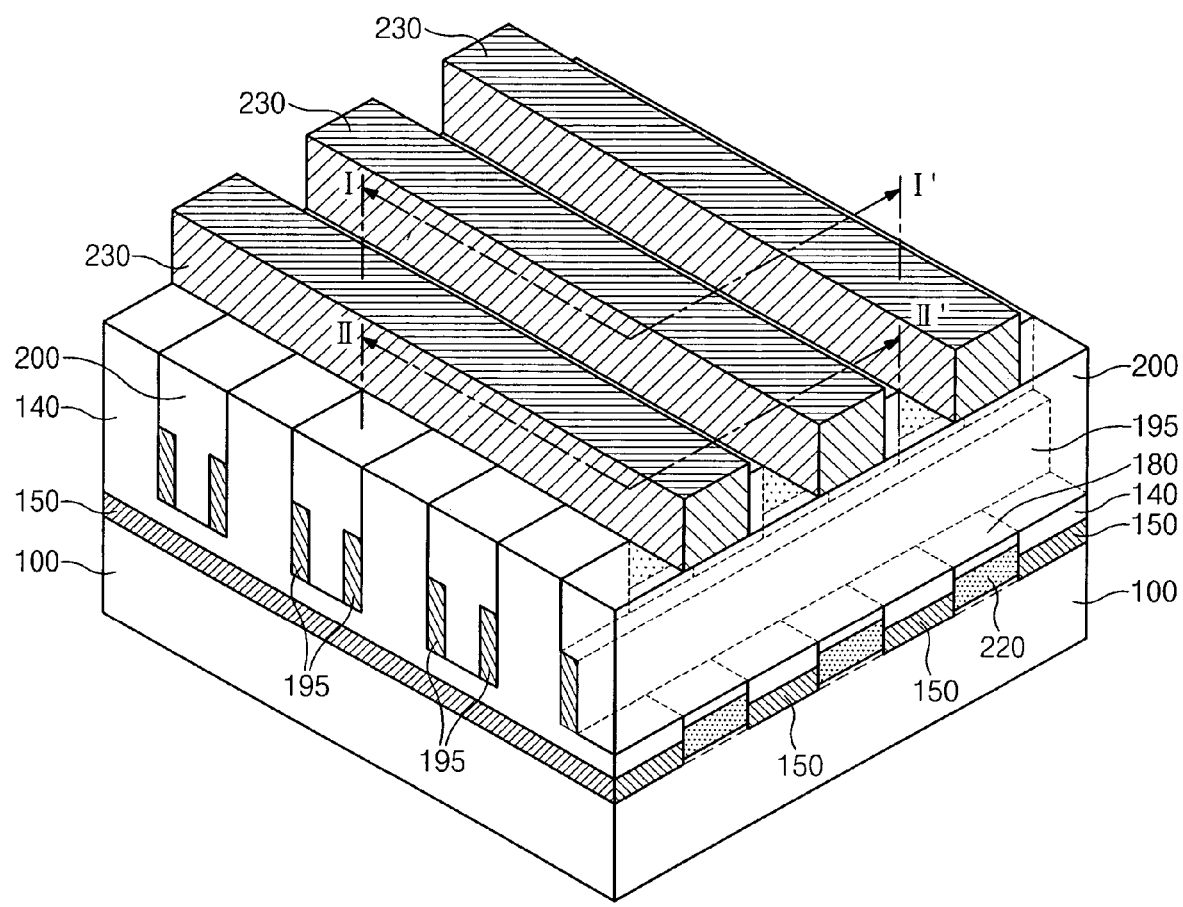
Figure 5B:
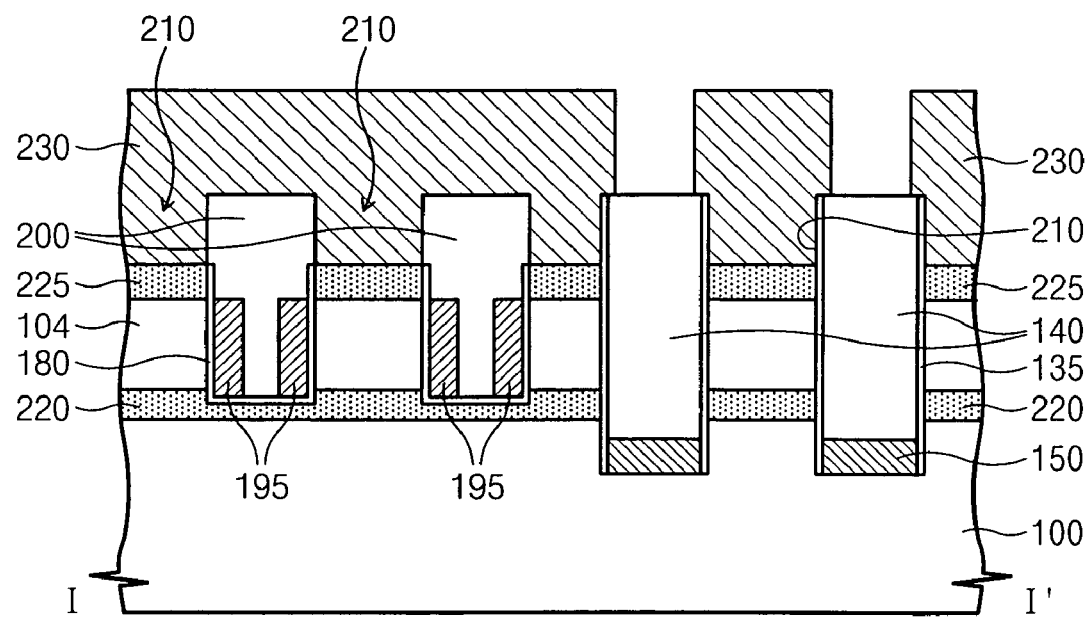
Figure 5C:
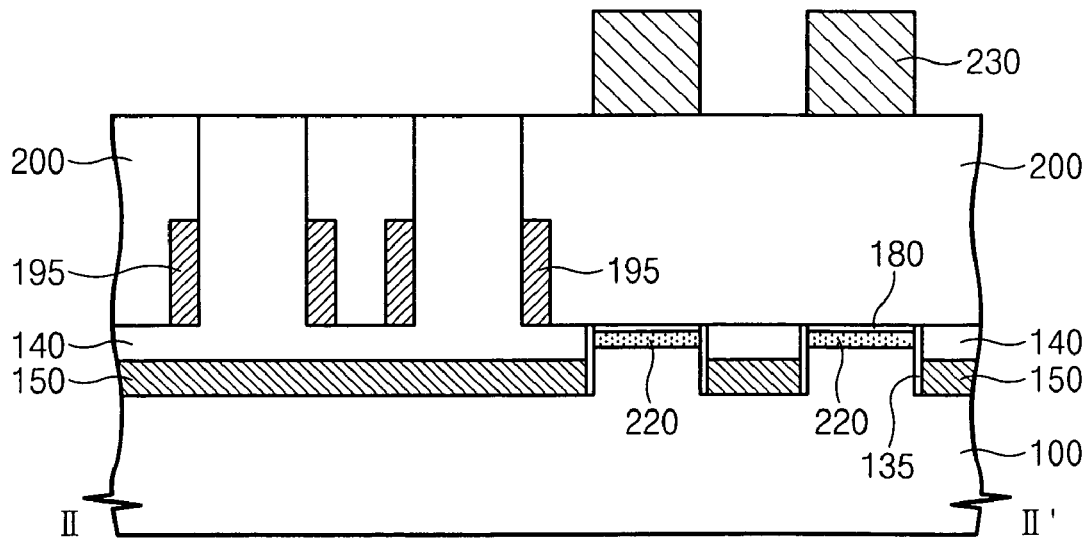

Referring to FIGS. 5A through 5C, a second insulation film is deposited on the resultant structure including the word lines 195. The second insulation film has etching selectivity to the first and second mask patterns 110 and 160, but, the second insulation film is preferred not to have etching selectivity to the first insulation patterns 140. For example, the second insulation film is made of silicon oxide. The second insulation film is eroded to be flattened until exposing the top surfaces of the first mask patterns 110, forming second insulation patterns 200 filling the second trenches 170. The remaining second mask patterns 160 are removed during the flattening process. As a result, this flattening process exposes top surfaces of the first insulation patterns 140, and the first and second insulation patterns 140 and 200.

The first mask patterns 110 exposed by the former processing step are removed therefrom, forming openings 210 that expose top surfaces of the active patterns 104. Removing the first mask pattern 110 includes a step of wet-etching the first and second insulation patterns 140 and 200 with a recipe having etching selectivity thereto. According to embodiments of the invention, as the first mask patterns 110 are used as an etching mask for making the active patterns 104, the openings 210 are sized to have the same area as top surfaces of the active patterns 104.

Next, an ion implantation process is carried out on the resultant structure including the openings 210, forming upper impurity regions 225 at the top portions of the exposed active patterns 104. The upper impurity regions 225 of the active patterns 104 may be used as drain regions of the transistors. Regions between the lower impurity regions 220 and the upper impurity regions 225 of the active patterns 104 are used as channel regions of the transistors. Forming the upper impurity regions 225 may employ a process of diffusion or epitaxial growth with silicon. On the resultant structure including the upper impurity regions 225, a bit-line conductive film is deposited with filing the openings 210. The bit-line conductive film is preferred to be made of a metallic material such as aluminum. Thereafter, the bit-line conductive film is patterned to form bit lines 230 contacting directly with the active patterns 104 (especially, the upper impurity regions 225). The bit lines 230 are arranged intersecting the word lines 195. Here, the openings 210 appearing by removing the first mask patterns 110 are used as contact holes to connect the bit lines 230 with the active patterns 104. Thus, the semiconductor device by the invention is fabricated without additional photolithography and etching steps of forming interlevel insulation films and contact holes.

FIGS. 8A through 12A are perspective views illustrating processing steps for fabricating a DRAM device in accordance with a second embodiment of the invention. FIGS. 8B through 12B and 8C through 12C are sectional views illustrating processing steps for fabricating a DRAM device in accordance with the second embodiment of the invention, taken along the dashed lines I-I' and II-II', respectively, of FIGS. 8A through 12A. According to the second embodiment, the first trenches are arranged along the extension of the word lines and the word lines are formed before grooving the second trenches, which is different from the feature of the first embodiment. For clarity of description, description of feature of the second embodiment that are the same as those of the first embodiment will not be repeated.

Figure 8A:
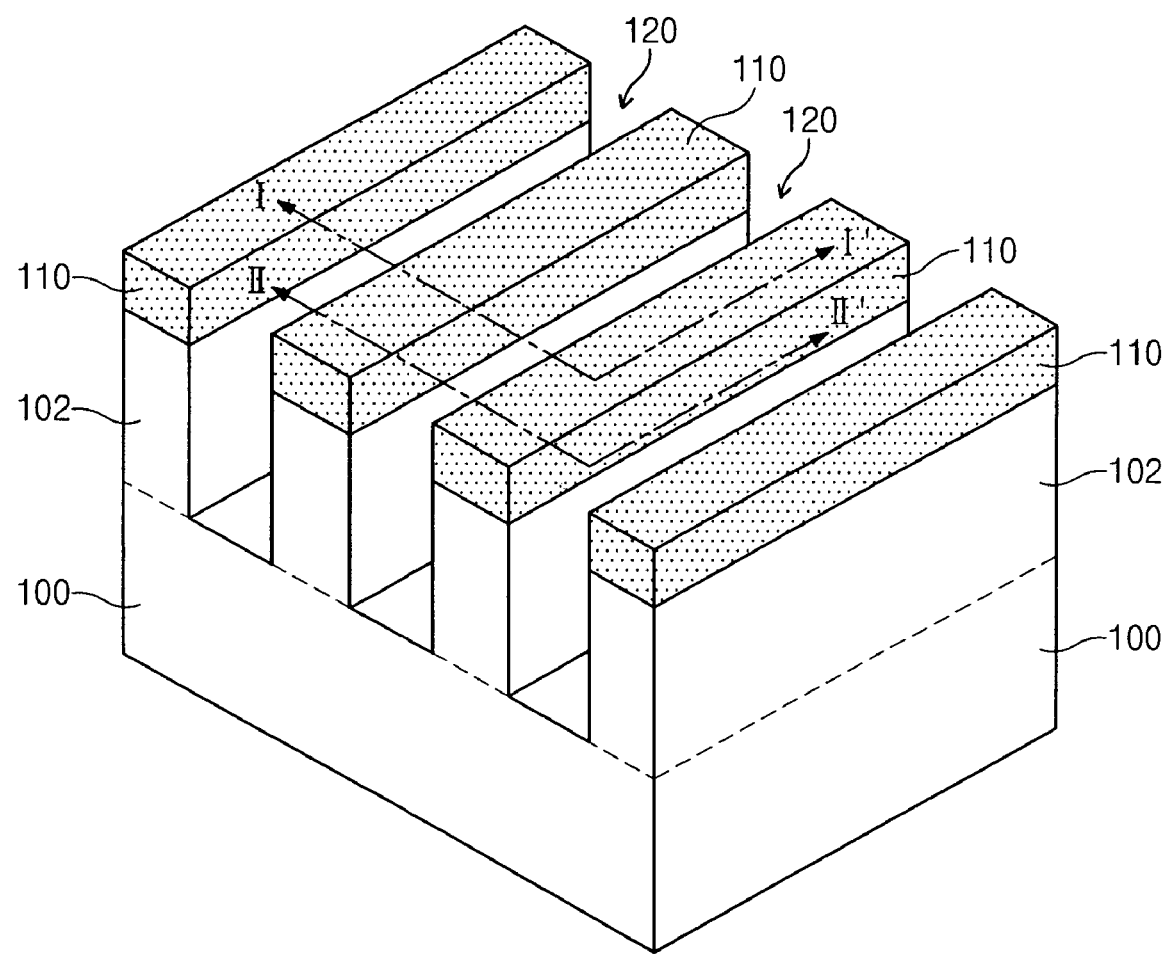
Figure 8B:
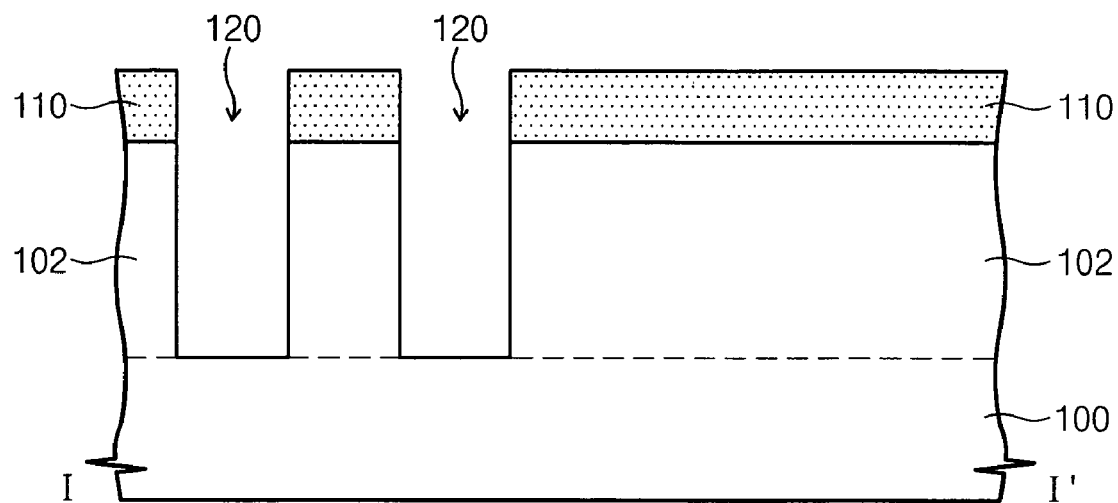
Figure 8C:
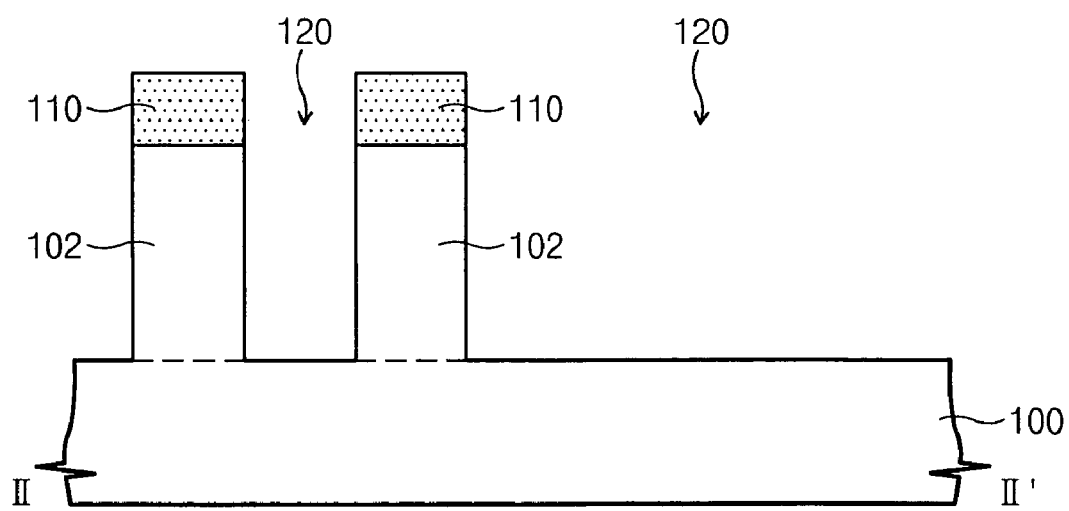

Referring to FIGS. 8A through 8C, the first mask patterns 110 are used to form the first trenches 120 that define the active regions 102. According to the first embodiment described above, the first trenches 120 are arranged intersecting the word lines 195 (see FIG. 4A), but, in the second embodiment, the first mask patterns 110 and the first trenches 120 are arranged in parallel with the word lines 195 to be formed by the subsequent processing step.

Figure 9A:
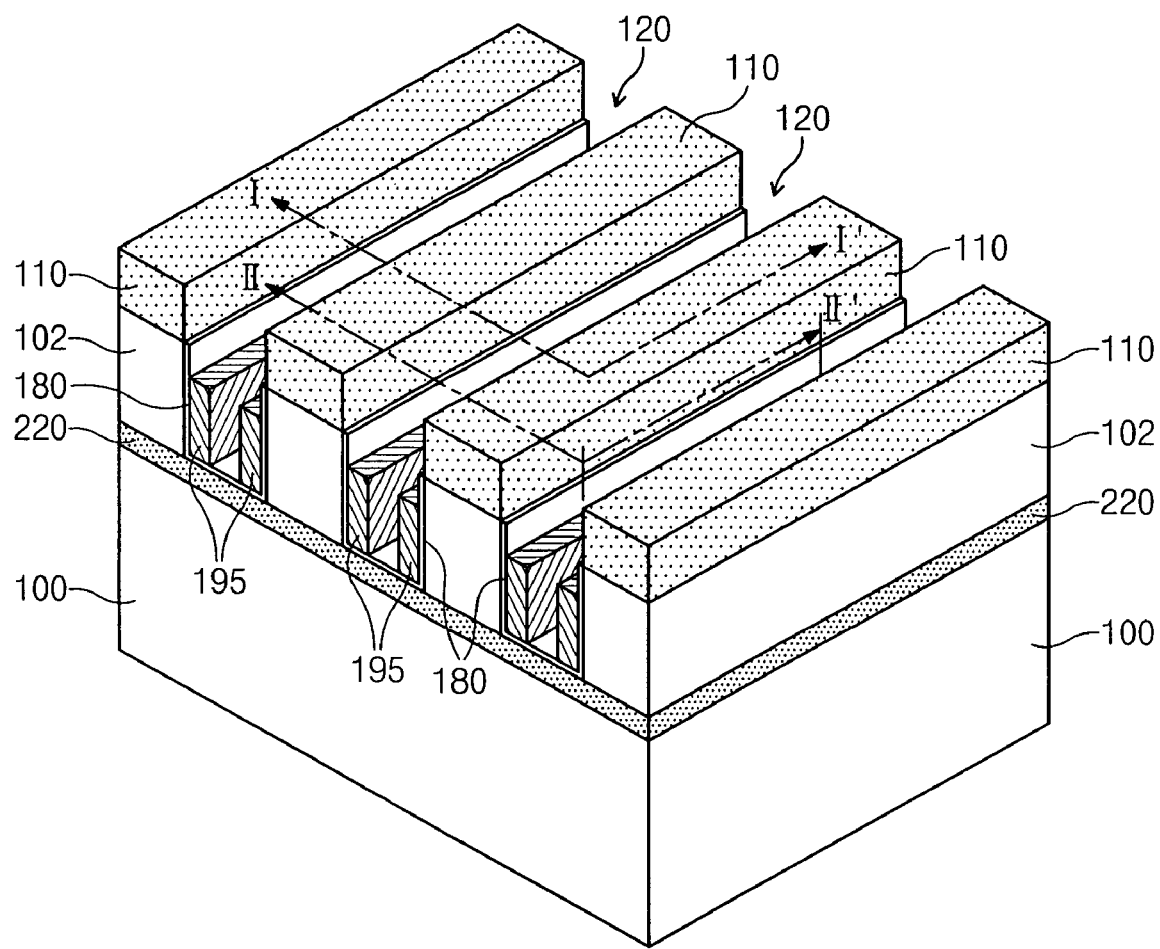
Figure 9B:
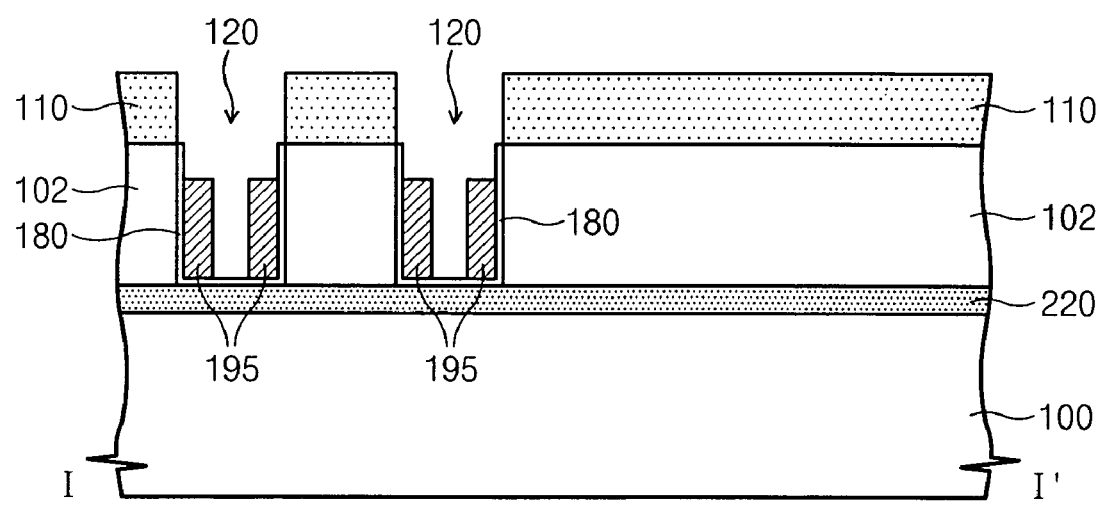
Figure 9C:
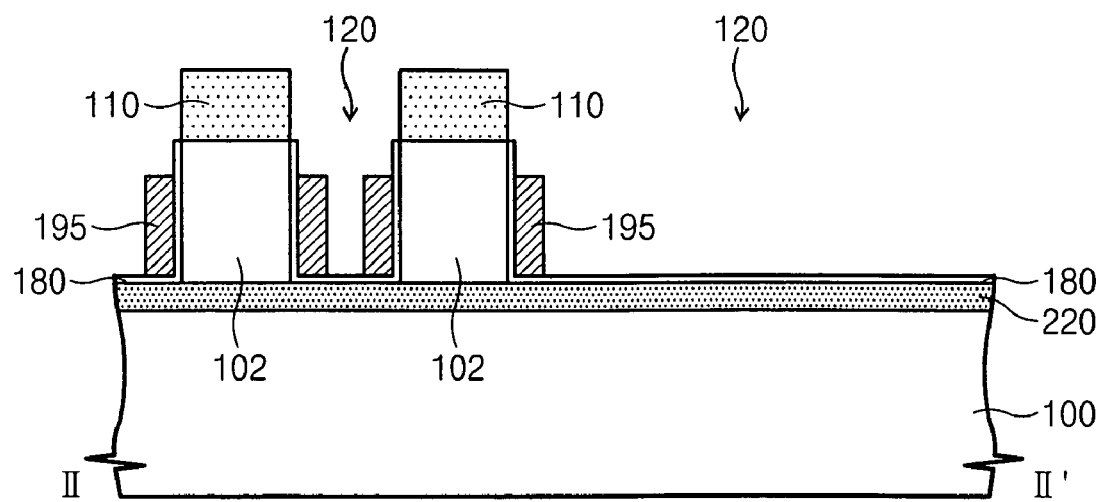

Referring to FIGS. 9A through 9C, the gate insulation films 180 and the word lines 195 are formed on the inner walls of the first trenches 120. The gate insulation films 180 and the word lines 195 may be completed by the same steps as those of the first embodiment or the modifications thereof. In this embodiment, the gate insulation films 180 may be formed all over inner walls of the first trenches 120.

Before forming the gate insulation films 180 or after forming the word lines 195, the lower impurity regions 220 are formed under the active regions 102. As in the first embodiment, the lower impurity regions 220 are used as the source regions of the transistors. The procedure of forming the lower impurity regions 220 is the same as that of the first embodiment.

Figure 10A:
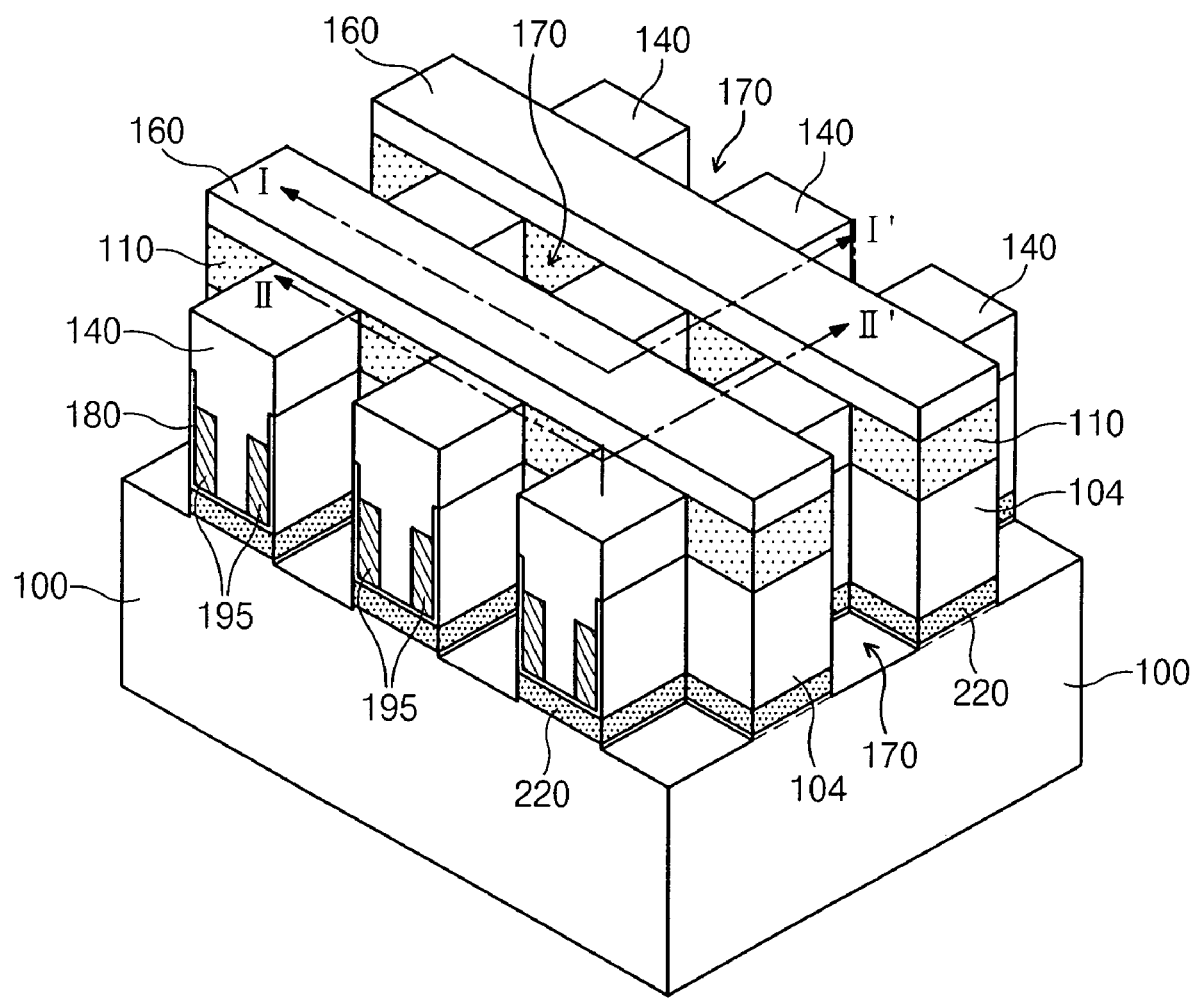
Figure 10B:
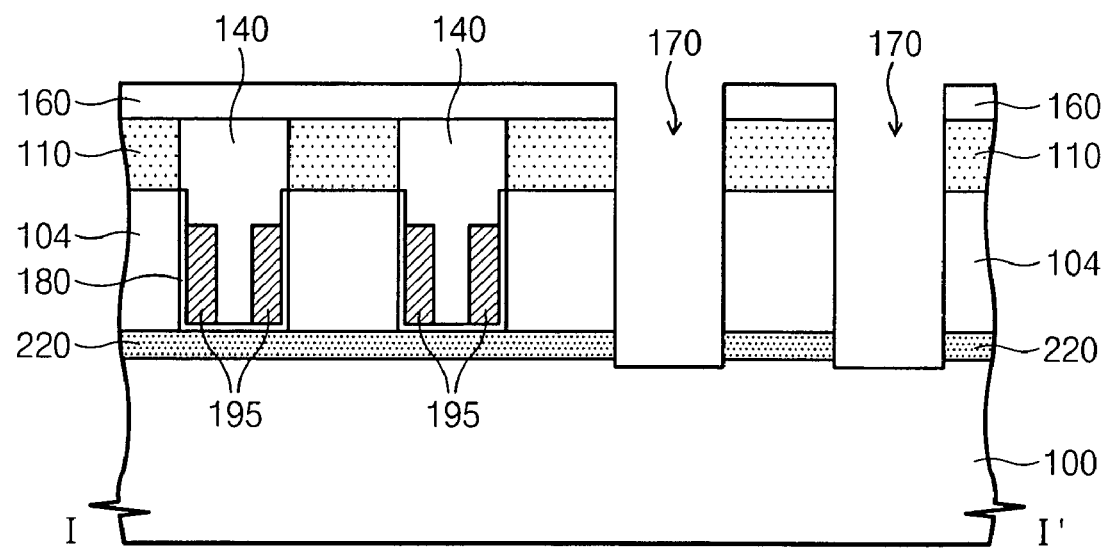
Figure 10C:
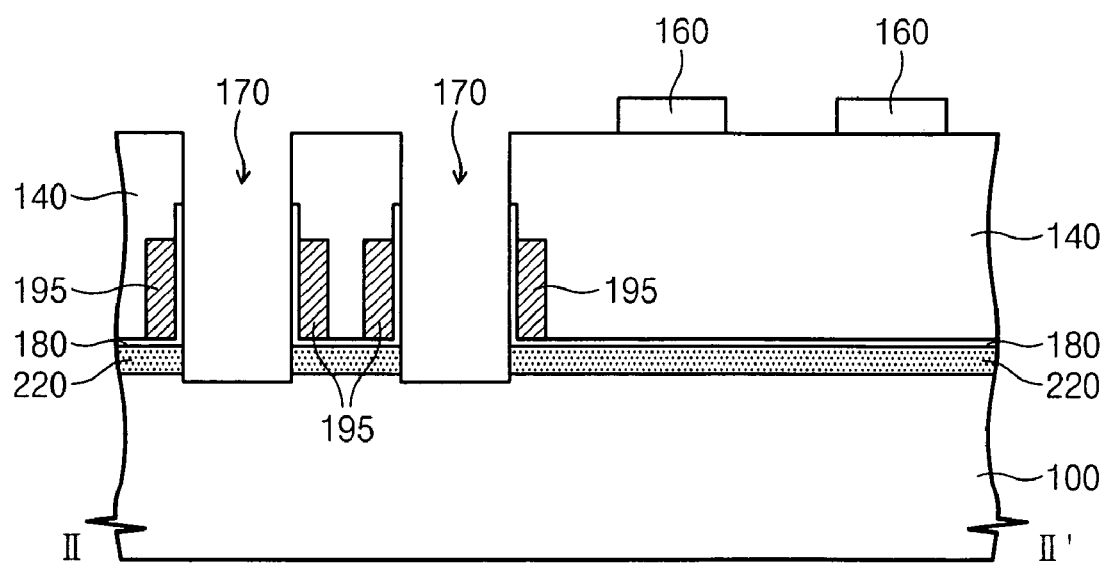

Referring to FIGS. 10A through 10C, the first insulation film is deposited on the resultant structure including the word lines 195 and then eroded to be flattened until exposing the first mask patterns 110, resulting in the first insulation patterns 140 to fill up the first trenches 120 that include the word lines 195.

The second mask patterns 160 are formed intersecting the first insulation patterns 140 and the first mask patterns 110. Using the second mask patterns 160 as an etching mask, the first mask patterns 110 and the active regions 102 are sequentially and selectively etched away to form the second trenches 170 that define the active patterns 104. According to this embodiment, the second trenches 170 are in the shape of holes surrounded by the active patterns 104 and the first insulation patterns 140, as shown in FIGS. 10A through 10C. For this configuration, an etching process of grooving the second trenches 170 is carried out with a recipe having etching selectivity to the first insulation patterns 140 and the gate insulation films 180.

Figure 11A:
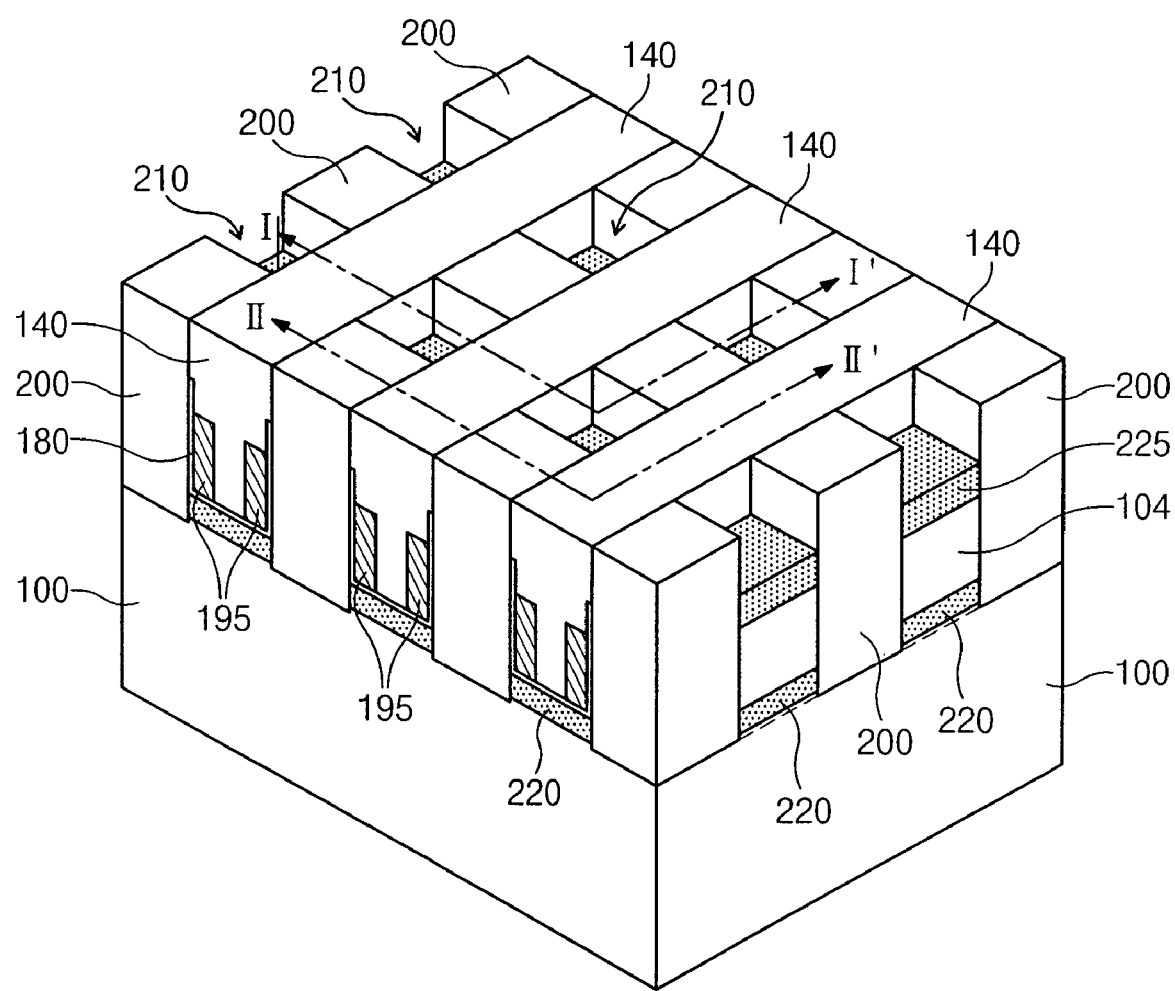
Figure 11B:
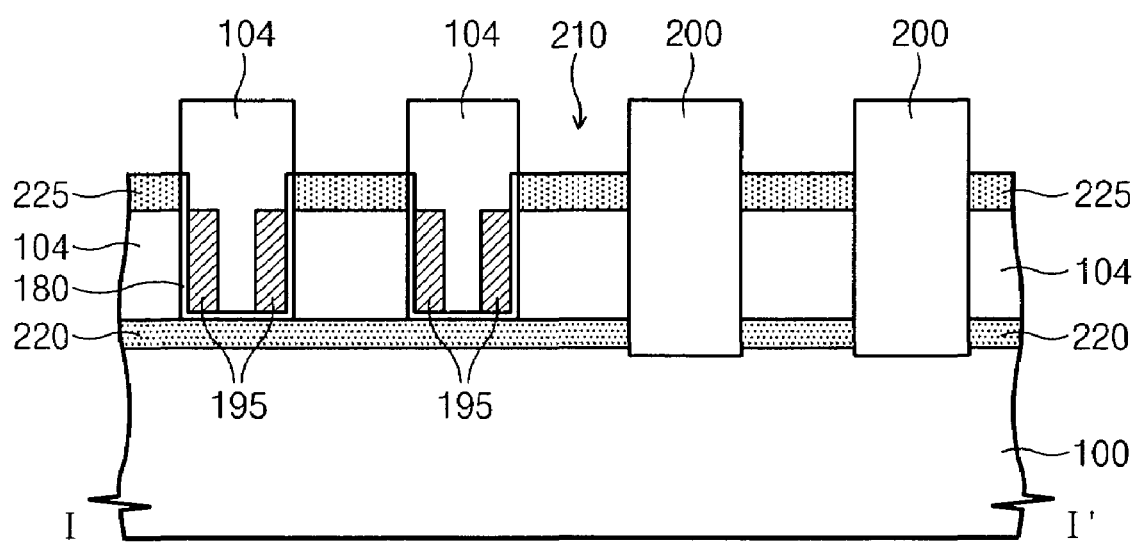
Figure 11C:
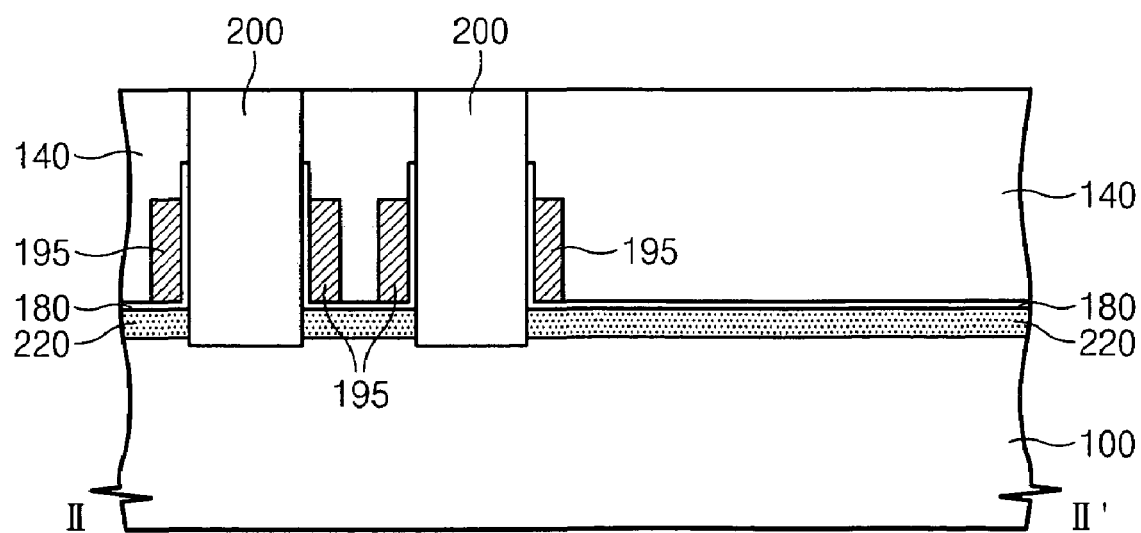

Referring to FIGS. 11A through 11C, after removing the second mask patterns 160, the second insulation patterns 200 are formed to fill up the second trenches 170. Forming the second insulation patterns 200 is conducted including a step of depositing the second insulation film to fill the second trenches 170 and then etching to flatten the second insulation film until exposing the top surfaces of the first mask patterns 110. By a modification of this embodiment, the second mask patterns 160 may be removed during the flattening etch process. The second insulation patterns 200 may be made of the same material as the first insulation patterns 140.

The first mask patterns 110 exposed by the flattening process are removed to the top surfaces of the active patterns 104. The upper impurity regions 225 are formed in the top portions of the exposed active patterns 104. The procedures of removing the first mask patterns 110 and forming the upper impurity regions 225 are the same as those of the first embodiment.

Figure 12A:
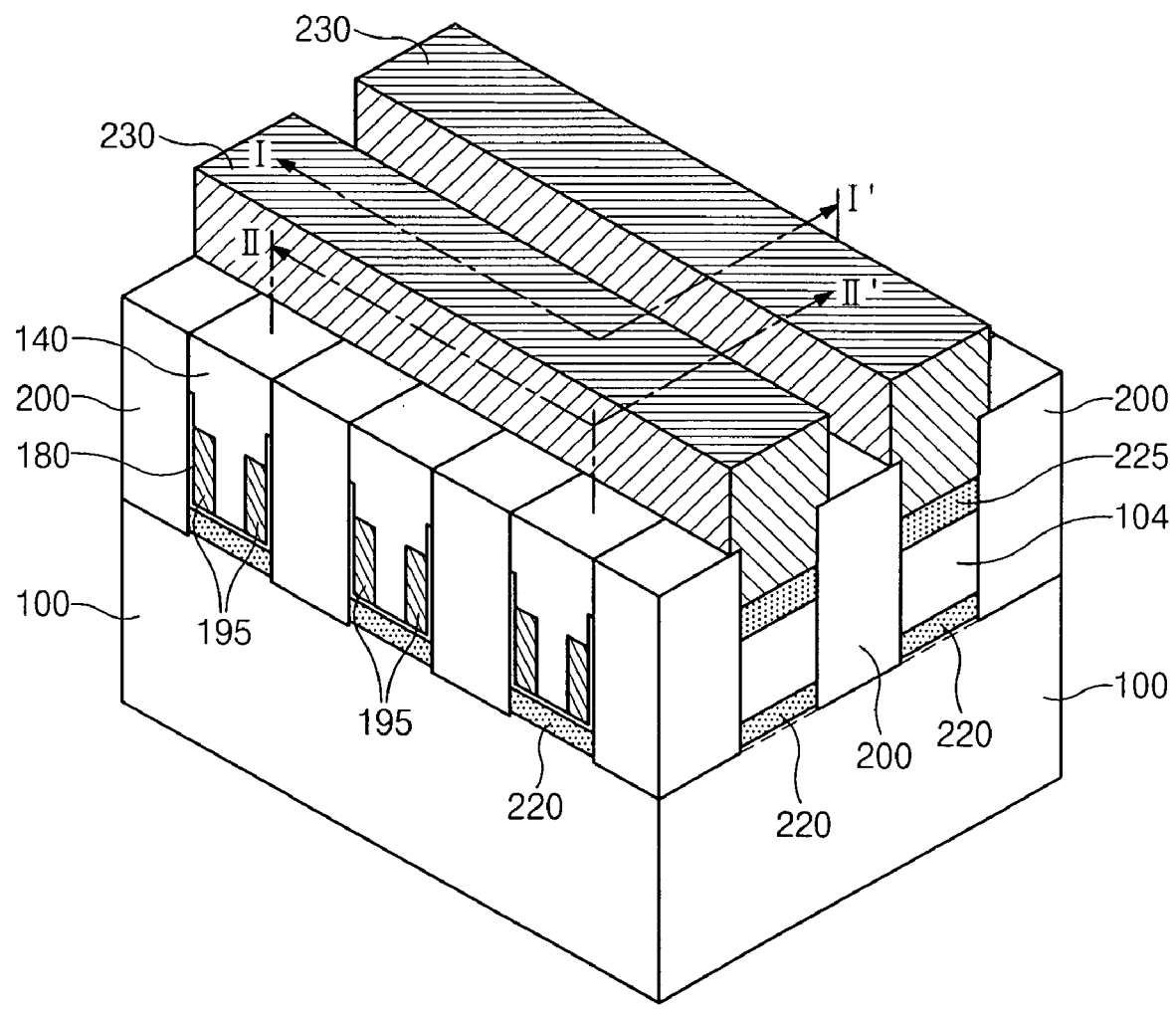
Figure 12B:
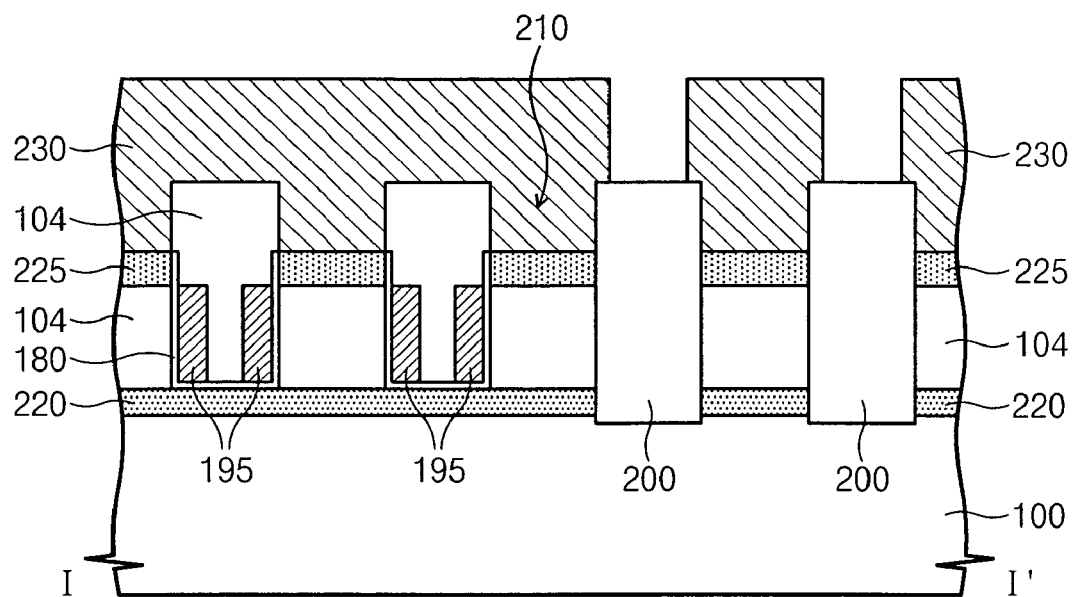
Figure 12C:
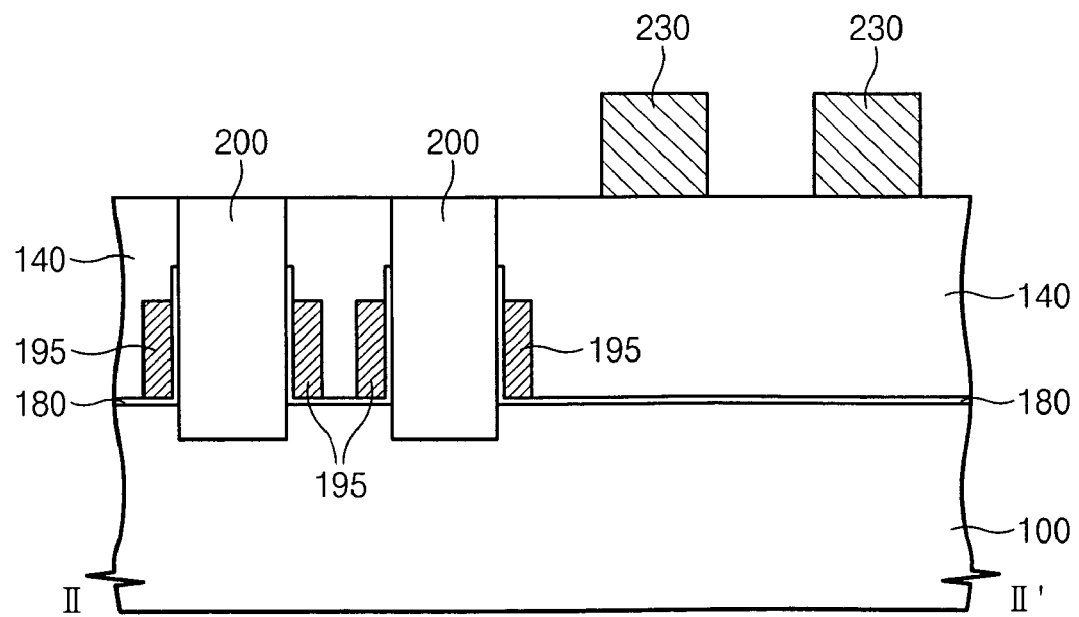

Referring to FIGS. 12A to 12C, bit lines 230 are formed to be connected with the upper impurity regions 225. The bit lines 230 are formed to cross over the word lines 195. The forming of the bit lines 230 may be also identical with that of the first embodiment of the present invention.

Figure 13A:
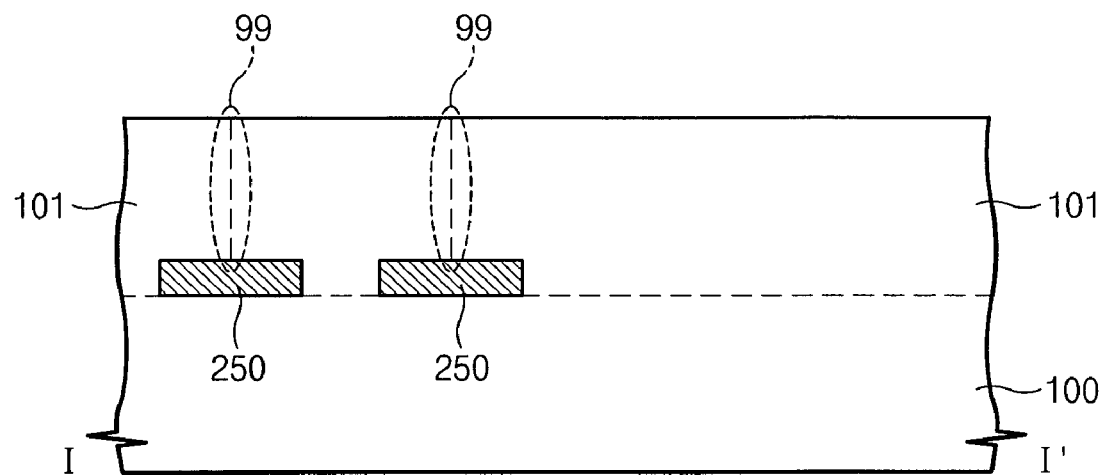
FIGS. 13A through 13C are sectional views illustrating processing steps for fabricating a DRAM device in accordance with a modified embodiment of the invention.
Figure 13B:
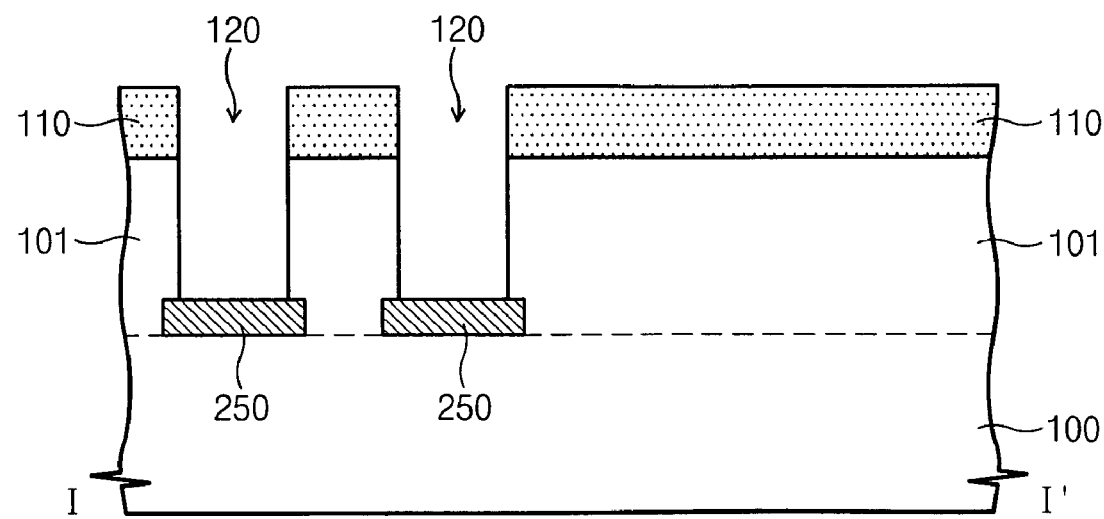
Figure 13C:
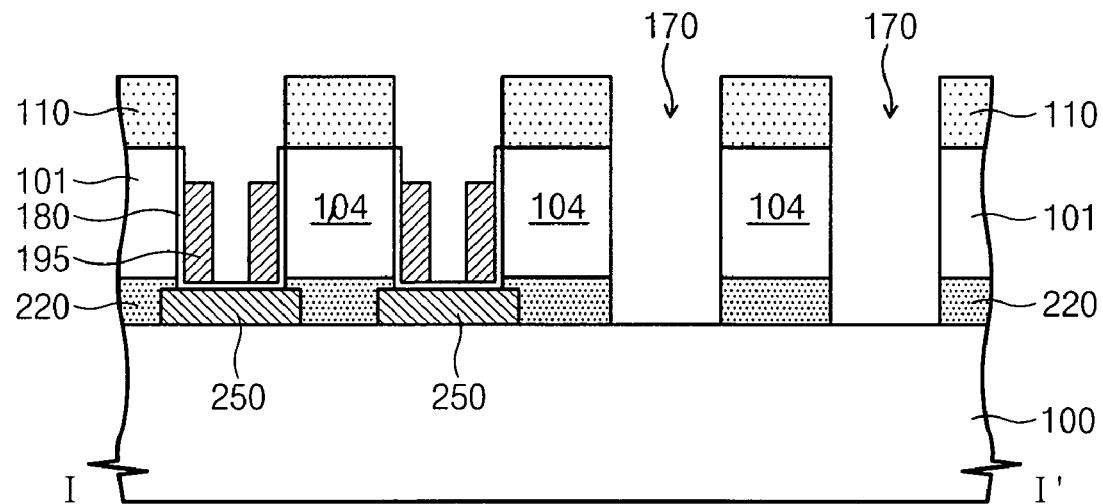

FIGS. 13A through 13C are sectional views illustrating processing steps for fabricating a DRAM device in accordance with a modified embodiment by the invention, in which conductive patterns are formed under the word lines 195. According to these embodiments, under the word lines 195, the conductive patterns 250 may be disposed being conductively connected to the lower impurity regions 220. As such, this feature shown in FIGS. 13A through 13C, in which the conductive patterns 250 are located under the word lines 195, is different from the first embodiment (see FIG. 2A) where the conductive patterns 150 are settled on the bottoms of the first trenches 120.

Referring to FIG. 13A, the conductive patterns 250 are formed on predetermined regions of the semiconductor substrate 100. The conductive patterns 250 are disposed at the regions where the word lines 195 are arranged as illustrated in FIG. 13A. Among the conductive patterns 250, the top surfaces of the semiconductor substrate 100 are exposed thereby. The conductive patterns 250 may be made of at least one of polysilicon, silicide, and metal. As described below, on the conductive patterns 250 may be disposed insulation patterns 255 that have been used as an etching mask.

Subsequently, an epitaxial process is carried out using the exposed portions of the semiconductor substrate 100 as seed layers, forming an epitaxial layer 101. As the epitaxial layer 101 is constituted in a single crystalline structure as same as the semiconductor substrate 100, it is able to be used as the channel regions of the transistors. A lattice structure of most conductive patterns 250 is not single-crystalline, and thus, discontinuous interfaces 99, from which the single crystalline structure is not continued, are generated on the conductive patterns 250.

Referring to FIGS. 13B and 13C, after forming the first trenches 120 on the conductive patterns 250, the gate insulation films 180 and the word lines 195 are formed in the first trenches 120. The steps of forming the first trenches 120, the gate insulation films 180, and the word lines 195 are as same with those of the second embodiment. During this, as the first trenches 120 are formed on the conductive patterns 250, the discontinuous interfaced 99 are removed therefrom. Therefore, there is no influence on characteristics of transistors by the discontinuous interfaces 99.

Figure 14A:
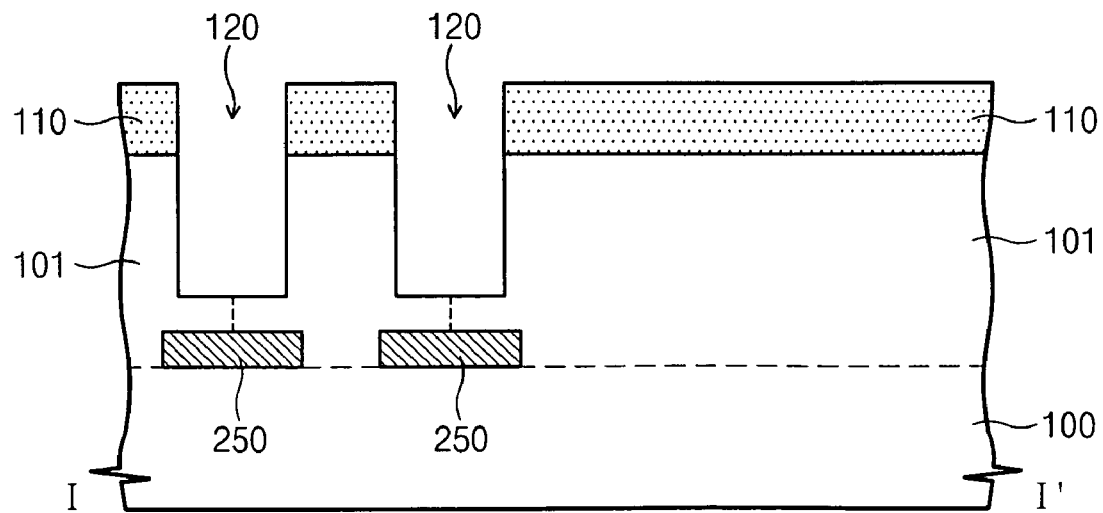
FIGS. 14A and 14B are sectional views illustrating processing steps for fabricating a DRAM device in accordance with another modification of the invention.
Figure 14B:
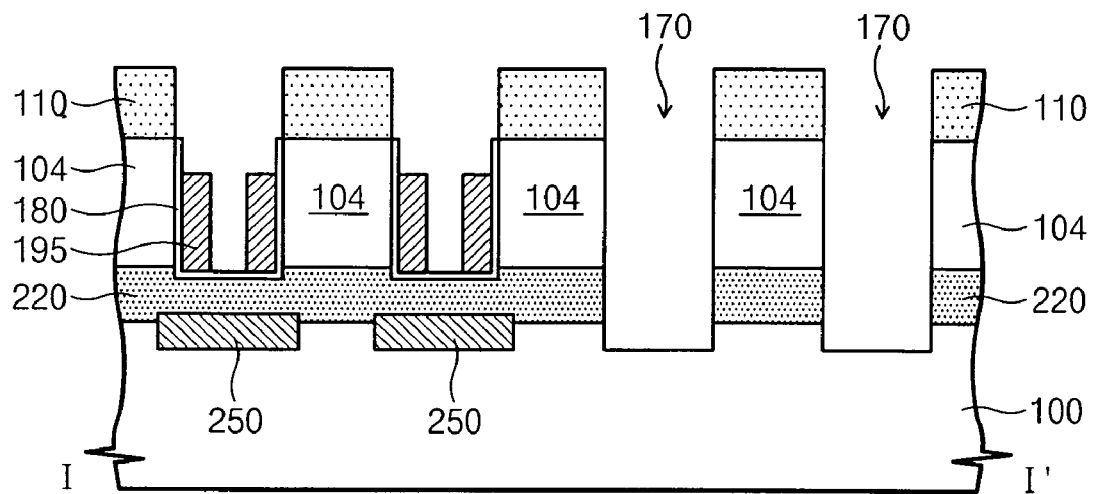

According to another embodiment, as shown in FIGS. 14A and 14B, the bottom surfaces of the first trenches 120 may be separated from the conductive patterns 250. That is, the epitaxial layer 101 may be interposed between the first trenches 120 and the conductive patterns 250.

Figure 15:
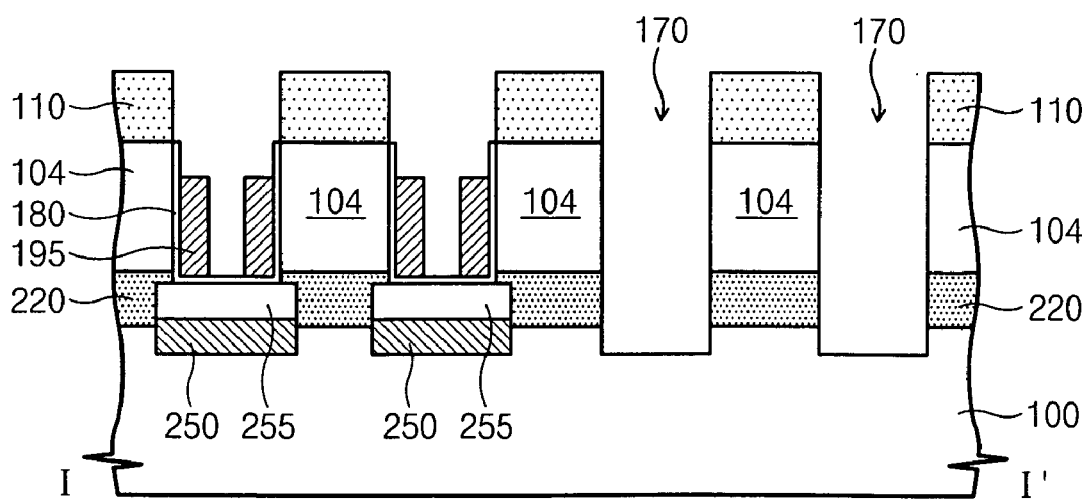
FIG. 15 is a sectional view illustrating a processing feature for fabricating a DRAM device in accordance with a still another modification of the invention.

According to the embodiments of the invention, the conductive patterns 250 are used as the source regions of the transistors. With this configuration, the conductive patterns 250 may be isolated from the word lines 195 by predetermined distances in order to reduce electrical interference among the word lines 195 and the conductive patterns 250. According to another embodiment of the invention, in order to assure the distances among the word lines 195 and the conductive patterns 250, the insulation patterns 255 are formed on the conductive patterns 250 (see FIG. 15). The insulation patterns 255 may be the remainder of the etching mask that has been used for the conductive patterns 250.

According to the invention, a vertical channel transistor is provided with the structure of the source, channel, and drain regions stacked in sequence. Thus, as it efficiently utilizes the area of the substrate, it is possible to remarkably raise a degree of integration in the device. For instance, a DRAM device of the invention is able to have the layout efficiency of $4F^2$.

Additionally, the invention provides a dual-gate vertical channel transistor having gate electrodes (i.e., the front and back-gate electrodes) that are disposed at both sides of the channel and conductively isolated from each other. With the dual-gate structure, the DRAM device of the invention does not need additional capacitors for storing charges. Thus, it simplifies the procedure of fabrication relative to the conventional DRAM case, efficient utilization of substrate area as well.

The method of fabricating the DRAM device according to the invention comprises a step for selectively removing the etching mask that is used to form the active patterns. Thus, it is possible to form the bit lines without an additional processing step for contact holes, reducing a product cost of the DRAM device.

Moreover, as the DRAM device of the invention is comprised of the source regions contacting with the conducting patterns that have low resistivity, it is possible to reduce sheet resistance on source lines. As a result, it is able to fabricate a DRAM device with excellent electrical characteristics.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A dynamic random access memory (DRAM) device comprising:
   a semiconductor substrate having a cell array field;
   pillar-shaped active patterns extended from the semiconductor substrate on the cell array field, each of the pillar-shaped active patterns including a source region contacting with the semiconductor substrate, a drain region formed over the source region, and a channel region interposed between the source and drain regions;
   bit lines arranged on the pillar-shaped active patterns, connecting the drain regions with each other along a direction;
   word lines interposed among the pillar-shaped active patterns, intersecting the bit lines; and
   gate insulation films interposed between the word lines and the pillar-shaped active patterns,
   wherein two word lines disposed at both sidewalls of one of the pillar-shaped active patterns are electrically separated from each other.

2. The DRAM device of claim 1, wherein an area where the bit line contacts with the pillar-shaped active patterns is identical to an area of top surface of the pillar-shaped active patterns.

3. The DRAM device of claim 1, further comprising conductive patterns disposed under the word lines to be contacted with the source regions.

4. The DRAM device of claim 3, further comprising an epitaxial layer with single crystalline structure in a predetermined thickness between the conductive pattern and the word line adjacent to the conductive pattern, wherein the epitaxial layer has an impurity region having the same impurity and the same concentration with the source region, the impurity region electrically connecting the source region to the conductive pattern.

5. The DRAM device of claim 3, wherein the gate insulation film extends to be interposed between the conductive pattern and the wordline adjacent to the conductive pattern.

6. The DRAM device of claim 1, further comprising conductive patterns intersecting the word lines interposed among the pillar-shaped active patterns, wherein the conductive patterns are disposed under the word lines to be connected with the source regions.

7. The DRAM device of claim 1, wherein two word lines disposed between two adjacent pillar-shaped active patterns are electrically separated from each other.

8. The DRAM device of claim 7, wherein all the word lines in the cell array field are electrically separated from each other.

* * * * *